United States Patent
Shigihara

(10) Patent No.: US 9,871,348 B2
(45) Date of Patent: Jan. 16, 2018

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/160,249

(22) Filed: May 20, 2016

(65) Prior Publication Data
US 2017/0117685 A1    Apr. 27, 2017

(30) Foreign Application Priority Data
Oct. 22, 2015   (JP) .................... 2015-208271

(51) Int. Cl.
*H01S 5/32* (2006.01)
*H01S 5/20* (2006.01)
(Continued)

(52) U.S. Cl.
CPC .............. *H01S 5/2031* (2013.01); *H01S 5/22* (2013.01); *H01S 5/3213* (2013.01); *H01S 5/2004* (2013.01); *H01S 5/34313* (2013.01)

(58) Field of Classification Search
CPC ............................ H01S 5/2031; H01S 5/3213
See application file for complete search history.

(56) References Cited

U.S. PATENT DOCUMENTS 6,185,237 B1    2/2001  Fukuhisa et al.
2002/0185643 A1*  12/2002  Uchida .................... H01S 5/22
                                                                     257/40
(Continued)

FOREIGN PATENT DOCUMENTS

JP   Hei05-243669 A   9/1993
JP   Hei11-233882 A   8/1999
(Continued)

OTHER PUBLICATIONS

M. Alam et al. (1994) "IEEE Photonics Technology Letters" vol. 6, No. 12, pp. 1418-1420.
(Continued)

*Primary Examiner* — Michael Carter
(74) *Attorney, Agent, or Firm* — Studebaker & Brackett PC

(57) ABSTRACT

An active layer is provided on a side closer to the second conductivity type cladding layer than a center of the light guide layer in the light guide layer. A first conductivity type low-refractive-index layer is formed between the first conductivity type cladding layer and the light guide layer and has a refractive index which is lower than a refractive index of the first conductivity type cladding layer. A layer thickness d of the light guide layer is a value at which a high-order mode equal to or higher than a first-order mode is permissible in a crystal growing direction by satisfying $$\frac{2\pi}{\lambda}\sqrt{n_g^2 - n_c^2}\frac{d}{2} \geq \frac{\pi}{2}.$$

The active layer is disposed at a position where a light confinement of the active layer becomes smaller compared to a case in which the active layer is disposed at a center of the light guide layer while there is not the first conductivity type low-refractive-index layer.

13 Claims, 27 Drawing Sheets

(51) Int. Cl.
*H01S 5/22* (2006.01)
*H01S 5/343* (2006.01)

(56) References Cited

U.S. PATENT DOCUMENTS

| | | | | |
|---|---|---|---|---|
| 2006/0126688 | A1* | 6/2006 | Kneissl | B82Y 20/00 372/43.01 |
| 2009/0080484 | A1* | 3/2009 | Shigihara | H01S 5/2031 372/46.01 |
| 2014/0294028 | A1* | 10/2014 | Shigihara | H01S 5/2027 372/45.01 |
| 2015/0023380 | A1 | 1/2015 | Shigihara | |

FOREIGN PATENT DOCUMENTS

| | | |
|---|---|---|
| JP | 2014-197598 A | 10/2014 |
| JP | 2015-023180 A | 2/2015 |
| WO | 1997/050158 A1 | 12/1997 |

OTHER PUBLICATIONS

Kenichi IGA, (Oct. 25, 1994), "Semiconductor Laser," Ohmsha, pp. 35-38.
Shojiro Kawakami (Sep. 20, 1982) "Optical Waveguide" Asakura Publishing Co., Ltd., p. 21.

\* cited by examiner

REFRACTIVE INDEX DISTRIBUTION        CARRIER DISTRIBUTION

SEMICONDUCTOR LASER DEVICE

BACKGROUND OF THE INVENTION

Field

The present invention relates to a semiconductor laser device capable of improving power conversion efficiency during high output power.

Background

As a light guide layer structure of a semiconductor laser device, there are structures such as an asymmetric structure in which a peak position of light confinement is displaced from a center of the light guide layer to a p-type cladding layer side and a symmetric structure in which an active layer is located at a center of the light guide layer and a peak position of light confinement is also located at the center of the light guide layer. A semiconductor laser is proposed in which an active layer is disposed at a position where light confinement of the active layer increases in the asymmetric structure than that in the symmetric structure (e.g., see Patent Literature 1: JP 2014-197598 A and Patent Literature 2: JP 2015-23180 A). This makes it possible to achieve both a reduction of a threshold current and an improvement of slope efficiency.

FIG. 28 is a diagram illustrating an optical output power-current (P-I) characteristic of a conventional asymmetric structure in comparison with a symmetric structure. The conventional asymmetric structure aims to reduce losses due to carriers in the light guide layer by displacing the position of the active layer from the center of the light guide layer to the p-type cladding layer side and improve slope efficiency. Furthermore, it is possible to reduce a threshold current by disposing the active layer at a position where light confinement of the active layer increases compared to the symmetric structure. Therefore, compared to the symmetric structure, the conventional asymmetric structure can achieve both a reduction of the threshold current and an improvement of slope efficiency.

However, when such a structure is intended to reduce an operating current during high output power and increase power conversion efficiency, the improvement of slope efficiency becomes more important than the reduction of the threshold current. This is because when the operating current is larger than the threshold current, for example, when the ratio between the two is ten times or more, the contribution of the threshold current to the power conversion efficiency is sufficiently small.

A method is also proposed which a first conductive-type low-refractive-index layer having a refractive index lower than a refractive index of a first conductive-type cladding layer is inserted between the first conductive-type cladding layer and a first conductive-type light guide layer to thereby expand a light intensity distribution in a crystal growing direction and narrow a far-field pattern (FFP) (e.g., see Patent Literature 3: JP 11-233882 A). However, it is a case where the light guide layer is thin and only a fundamental (0th-order) mode is permissible in the crystal growing direction that the light intensity distribution is expanded and the far-field pattern (FFP) is narrowed. When the light guide layer is so thick that a high-order mode equal to or higher than the first-order mode is permissible, the light intensity is conversely narrowed and the FFP expands.

The semiconductor laser device having a conventional asymmetric structure can achieve both a reduction of the threshold current and an improvement of slope efficiency, but the improvement of power conversion efficiency during high output power is limited.

SUMMARY

The present invention has been implemented to solve the above-described problems and it is an object of the present invention to provide a semiconductor laser device capable of improving power conversion efficiency during high output power.

According to the present invention, a semiconductor laser device includes: a semiconductor substrate of a first conductivity type; a first conductivity type cladding layer on the semiconductor substrate; a light guide layer on the first conductivity type cladding layer; a second conductivity type cladding layer on the light guide layer; an active layer on a side closer to the second conductivity type cladding layer than a center of the light guide layer in the light guide layer; and a first conductivity type low-refractive-index layer formed between the first conductivity type cladding layer and the light guide layer and having a refractive index which is lower than a refractive index of the first conductivity type cladding layer, wherein λ is an oscillating wavelength of the semiconductor laser device, nc is refractive indexes of the first conductivity type cladding layer and the second conductivity type cladding layer, ng is a refractive index of the light guide layer, a layer thickness d of the light guide layer is a value at which a high-order mode equal to or higher than a first-order mode is permissible in a crystal growing direction by satisfying $$\frac{2\pi}{\lambda}\sqrt{n_g^2 - n_c^2}\frac{d}{2} \geq \frac{\pi}{2},$$

and the active layer is disposed at a position where a light confinement of the active layer becomes smaller compared to a case in which the active layer is disposed at a center of the light guide layer while there is not the first conductivity type low-refractive-index layer.

In the present invention, the active layer is disposed at a position where the light confinement of the active layer becomes smaller compared to a case with a symmetric structure in which the active layer is disposed at the center of the light guide layer while there is not the first conductivity type low-refractive-index layer. It is possible to increase the slope efficiency compared to the symmetric structure and the conventional asymmetric structure. As a result, it is possible to reduce an operating current during high output power and improve the power conversion efficiency.

Other and further objects, features and advantages of the invention will appear more fully from the following description.

DESCRIPTION OF EMBODIMENTS

A semiconductor laser device according to the embodiments of the present invention will be described with reference to the drawings. The same components will be denoted by the same symbols, and the repeated description thereof may be omitted.

First Embodiment

Figure 1:
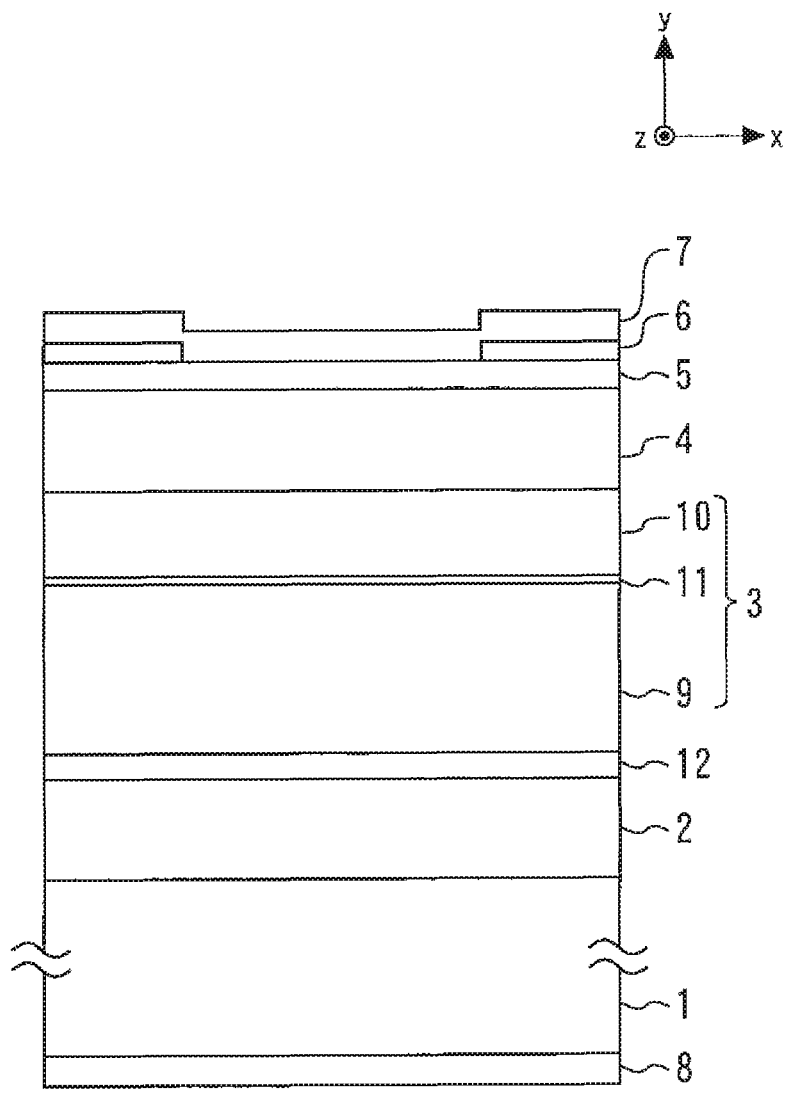
FIG. 1 is a cross-sectional view illustrating a semiconductor laser device according to a first embodiment of the present invention.

FIG. 1 is a cross-sectional view illustrating a semiconductor laser device according to a first embodiment of the present invention. An n-type AlGaAs cladding layer 2 having an Al composition ratio of 0.250 and a layer thickness of 1.5 μm is formed on an n-type GaAs substrate 1. A light guide layer 3 is formed on the n-type AlGaAs cladding layer 2.

A p-type AlGaAs cladding layer 4 having an Al composition ratio of 0.250 and a layer thickness of 1.5 μm is formed on the light guide layer 3. A p-type GaAs contact layer 5 having a layer thickness of 0.2 μm is formed on the p-type AlGaAs cladding layer 4.

A SiN film 6 having a film thickness of 0.2 μm is formed on the p-type GaAs contact layer 5. A p-type electrode 7 is formed on the SiN film 6 and electrically connected to the p-type GaAs contact layer 5 through an opening of the SiN film 6. An n-type electrode 8 is formed on a rear surface of the n-type GaAs substrate 1.

The light guide layer 3 includes an n-side AlGaAs light guide layer 9 having an Al composition ratio of 0.210 and a layer thickness of do and a p-side AlGaAs light guide layer 10 having an Al composition ratio of 0.210 and a layer thickness of dp formed thereon.

An active layer 11 of an InGaAs quantum well having an In composition ratio of 0.063 and a layer thickness of 10 nm is formed between the n-side AlGaAs light guide layer 9 and the p-side AlGaAs light guide layer 10. The n-side AlGaAs light guide layer 9, the p-side AlGaAs light guide layer 10 and the active layer 11 are undoped layers in which no intentional doping is performed.

The In composition ratio and the layer thickness of the active layer 11 of the InGaAs quantum well are assumed to be 0.063 and 10 nm respectively because the oscillating wavelength is assumed to be 915 nm. For example, according to Non-Patent Literature 1: "Semiconductor Laser" written and edited by Iga, pp. 35-38, Oct. 25, 1994 (Ohmsha, Ltd.), refractive indexes of AlGaAs layers having Al composition ratios of 0.210 and 0.250 with respect to light having a wavelength of 915 nm are 3.4196 and 3.3938 respectively. The refractive index of InGaAs having the In composition ratio of 0.063 is experimentally 3.5286.

Figure 2:
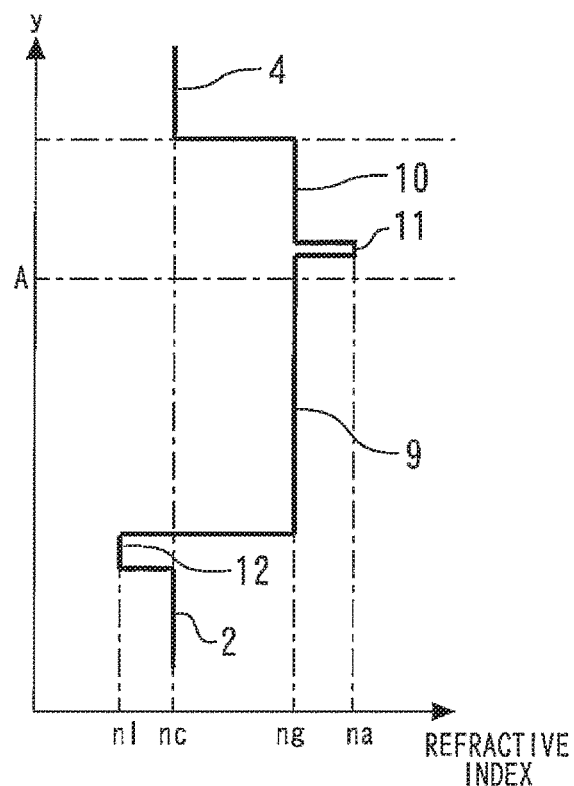
FIG. 2 is a diagram illustrating a refractive index distribution along a crystal growing direction in the vicinity of the active layer of the semiconductor laser device according to the first embodiment of the present invention.

An n-type AlGaAs low-refractive-index layer 12 having an Al composition ratio of x and a layer thickness of d1 is formed between the n-type AlGaAs cladding layer 2 and the light guide layer 3. FIG. 2 is a diagram illustrating a refractive index distribution along a crystal growing direction in the vicinity of the active layer of the semiconductor laser device according to the first embodiment of the present invention. A refractive index of the n-type AlGaAs cladding layer 2 and the p-type AlGaAs cladding layer 4 is nc. A refractive index na of the active layer 11 is greater than a refractive index ng of the n-side AlGaAs light guide layer 9 and the p-side AlGaAs light guide layer 10. The n-type AlGaAs low-refractive-index layer 12 has a refractive index nl which is lower than the refractive index nc of the n-type AlGaAs cladding layer 2.

A sum d=dn+dp of the layer thickness dn of the n-side AlGaAs light guide layer 9 and the layer thickness of the p-side AlGaAs light guide layer 10 is 1200 nm. The layer thickness dp of the p-side AlGaAs light guide layer 10 is smaller than the layer thickness dn of the n-side AlGaAs light guide layer 9. Therefore, the active layer 11 is formed on a side closer to the p-type AlGaAs cladding layer 4 than the center of the light guide layer 3 in the light guide layer 3.

Figure 3:
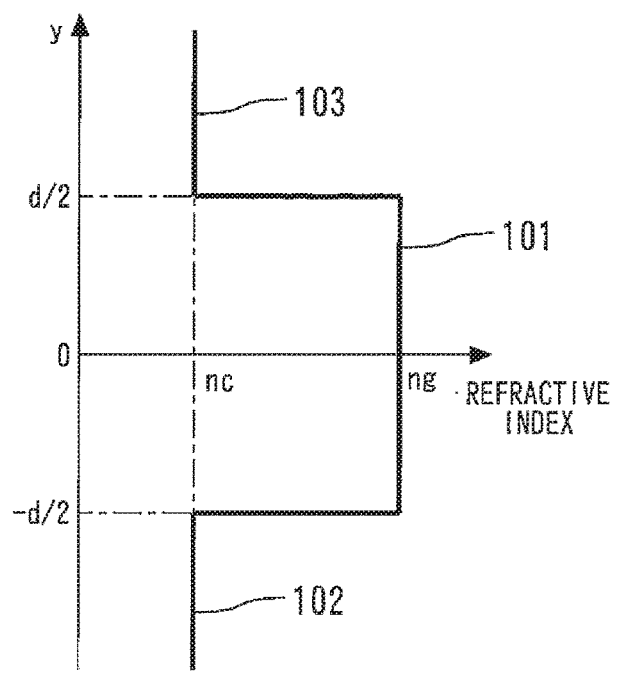
FIG. 3 is a diagram illustrating a structure for which a high-order mode equal to or higher than a first-order mode is permissible in a crystal growing direction.

FIG. 3 is a diagram illustrating a structure for which a high-order mode equal to or higher than a first-order mode is permissible in a crystal growing direction. A layer thickness of the light guide layer 101 is d and a refractive index thereof is ng. A refractive index of an n-type cladding layer 102 and a p-type cladding layer 103 is nc. A relationship of ng>nc is satisfied since light is trapped in the light guide layer 101 and caused to propagate through the light guide layer 101. When an oscillating wavelength of the semiconductor laser device is assumed to be λ, the number of waveguide modes permissible in the light guide layer 101 is determined by the value of normalized frequency v expressed by equation (1) (e.g., see Non-Patent Literature 2: Kawakami, "Optical Waveguide" pp. 21, Sep. 20, 1982 (Asakura Publishing Co., Ltd.).

$$v \equiv \frac{2\pi}{\lambda}\sqrt{n_g^2 - n_c^2}\frac{d}{2} \quad (1)$$

When $v<\pi/2$, only a fundamental (zeroth-order) mode is permissible, when $\pi/2 \leq v < \pi$, two modes: the fundamental (zeroth-order) mode and the first-order mode are permissible, and when $\pi \leq v < 3\pi/2$, three modes: fundamental (zeroth-order) mode, the first-order mode and the second-order mode are permissible. That is, the number of permissible modes increases as the value of v increases. More specifically, the greater the difference in refractive index between the light guide layer 101 and the cladding layer 102 or 103, or the greater the layer thickness of the light guide layer 101, the greater the number of permissible modes becomes.

When the value of normalized frequency v in equation (1) is calculated in the present embodiment, the value is 1.727 which is equal to or greater than $\pi/2$. Therefore, two modes: the fundamental mode (zeroth-order) and the first-order mode are permissible in the crystal growing (y) direction. However, when calculating the normal frequency, the active layer 11 of InGaAs having a layer thickness of 10 nm is ignored, but since the refractive index na of the active layer 11 is greater than the refractive index ng of the n-side AlGaAs light guide layer 9 and the p-side AlGaAs light guide layer 10, the refractive index na functions in the direction in which the normalized frequency is increased, and there is no change in the fact that a high-order mode is permissible in the crystal growing direction. Thus, in the present embodiment, the layer thickness d of the light guide layer 3 is set to a value at which a high-order mode equal to or higher than the first-order mode is permissible in the crystal growing direction by satisfying $\pi/2 \leq v$.

Figure 4:
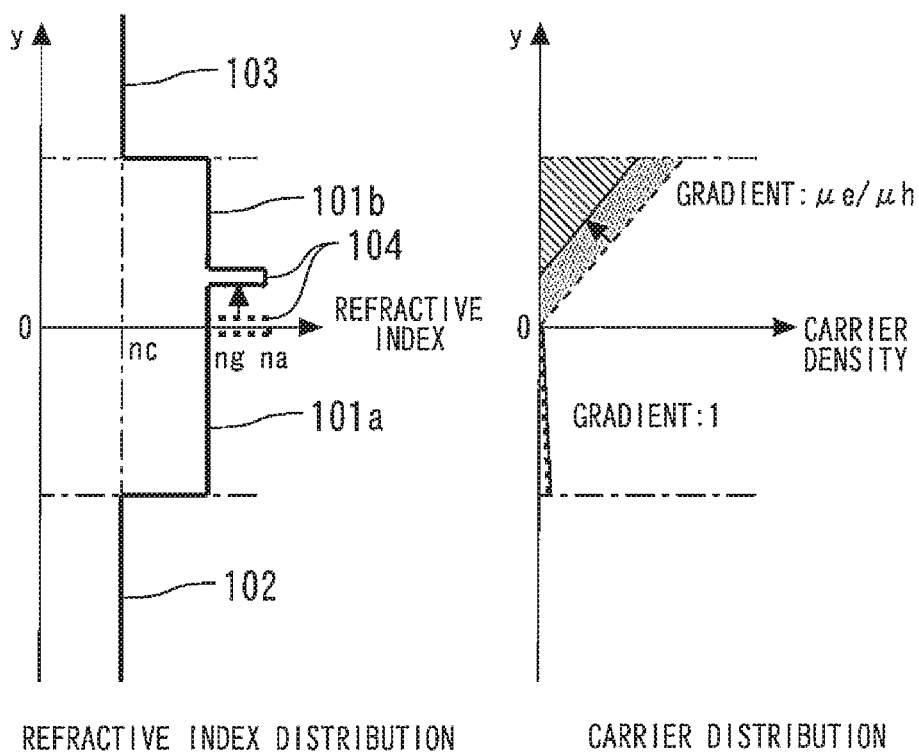
FIG. 4 is a diagram illustrating a refractive index distribution and a carrier distribution along a crystal growing direction in the guide layer of the semiconductor laser device.

FIG. 4 is a diagram illustrating a refractive index distribution and a carrier distribution along a crystal growing direction in the guide layer of the semiconductor laser device. The refractive index na of the active layer 104 is greater than the refractive index ng of a light guide layers 101a and 101b. The light guide layers 101a and 101b are obtained by dividing the light guide layer 101 in FIG. 3 into two regions.

The number of carriers in the light guide layers 101a and 101b is smallest at a position of the active layer 104 and monotonously increases toward the cladding layers 102 and 103. However, when a gradient in the n-side light guide layer 102 is assumed to be 1, a gradient in the p-side light guide layer 103 becomes µe/µh. Here, µe and µh are mobility of electrons and holes (e.g., see Non-Patent Literature 3: M. Alam et. al., "IEEE Photon. Technol. Lett.", pp. 1418-1420, 1994). Since mobility of electrons is normally greater than mobility of holes, µe/µh>1.

When the active layer 104 is displaced from the center of the light guide layers 101a and 101b toward the p-type cladding layer 103 side, the number of carriers in the n-side light guide layer 102 increases compared to a case where the active layer 104 is disposed at the center of the light guide layers 101a and 101b, whereas the number of carriers in the p-side light guide layer 103 decreases. Since the decrease in the number of carriers in the p-side light guide layer 103 is considerable, the total number of carriers in the light guide layers 101a and 101b decreases compared to a case where the active layer 104 is disposed at the center of the light guide layers 101a and 101b. For this reason, light absorption by carriers in the light guide layers 101a and 101b decreases, making it possible to increase slope efficiency of the semiconductor laser device.

Figure 5:
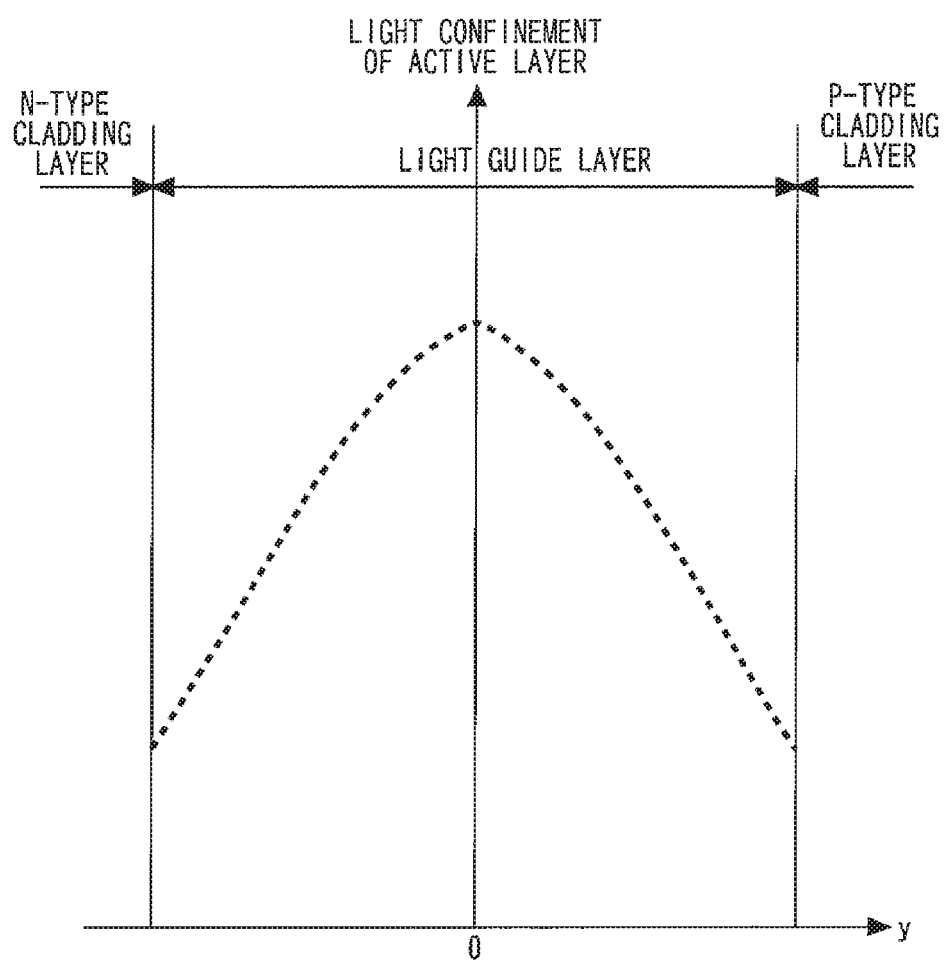
FIG. 5 is a diagram illustrating light confinement of the active layer when the position of the active layer is changed in the light guide layer when there is no low-refractive-index layer.

FIG. 5 is a diagram illustrating light confinement of the active layer when the position of the active layer is changed in the light guide layer when there is no low-refractive-index layer. While keeping the sum d of layer thickness of the light guide layer 3 constant at 1200 nm, the layer thickness do of the n-side AlGaAs light guide layer 9 and the layer thickness dp of the p-side AlGaAs light guide layer 10 are changed. It is observed that the light confinement of the active layer 11 is largest (dn=dp=600 nm) when the active layer 11 is located at the center of the light guide layer 3 and monotonously decreases as the active layer 11 is brought closer to the p-type AlGaAs cladding layer 4 or n-type AlGaAs cladding layer 2, and has a symmetric shape with respect to the center of the light guide layer 3.

Figure 6:
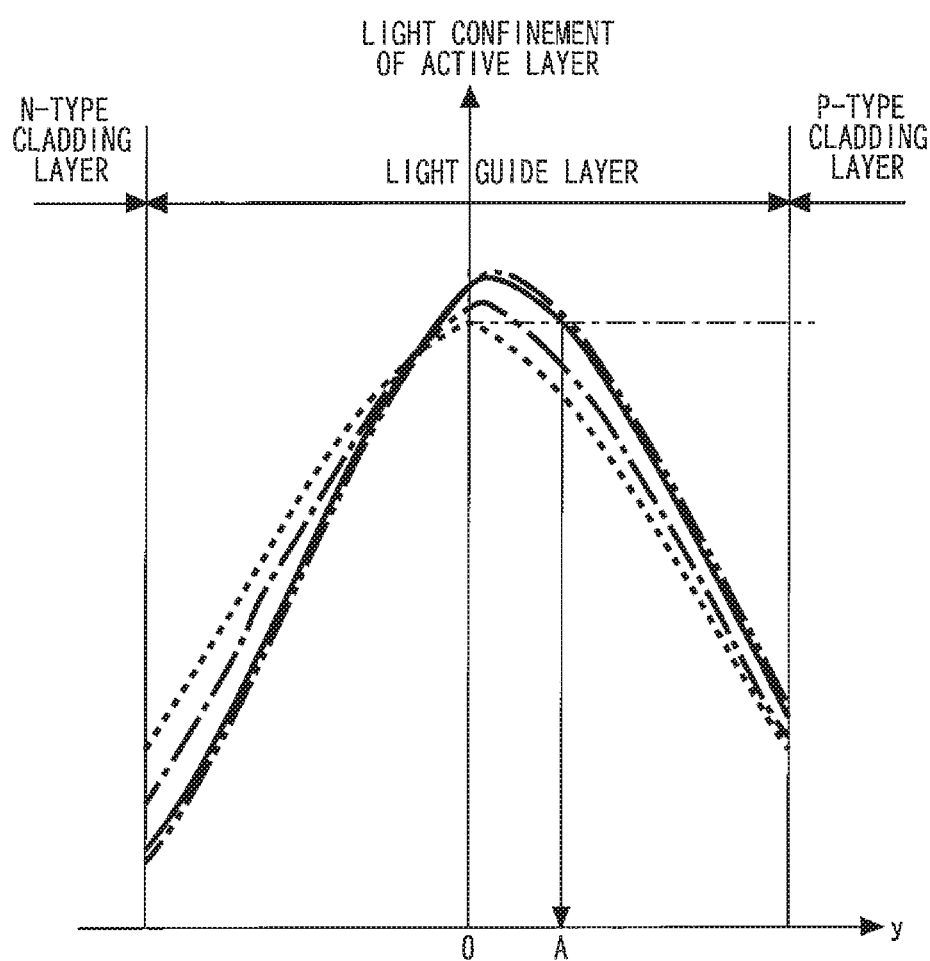
FIG. 6 is a diagram illustrating the light confinement of the active layer when the position of the active layer of the semiconductor laser device according to the first embodiment of the present invention is changed in the light guide layer.

FIG. 6 is a diagram illustrating the light confinement of the active layer when the position of the active layer of the semiconductor laser device according to the first embodiment of the present invention is changed in the light guide layer. A single-dot dashed line shows a case where a composition ratio x of Al of the n-type AlGaAs low-refractive-index layer 12 is 0.30, the layer thickness d1 is 100 nm, a solid line shows a case where x=0.35 and d1=200 nm, and a two-dot dashed line shows a case where the x=0.35 and d1=400 nm. A broken line shows a case where there is no n-type AlGaAs low-refractive-index layer 12. Note that refractive indexes of AlGaAs having composition ratios of 0.30 and 0.35 with respect to light having a wavelength of 915 nm are 3.3624 and 3.3315 respectively.

It is observed from FIG. 6 that as the Al composition ratio x of the n-type AlGaAs low-refractive-index layer 12 increases and the refractive index nl decreases, and as the layer thickness d1 of the n-type AlGaAs low-refractive-index layer 12 increases, the peak position of light confinement is displaced toward the p-type AlGaAs cladding layer 4 side and the value of light confinement at the peak position increases. Based on this, the operation of the n-type AlGaAs low-refractive-index layer 12 can be considered in the same way as light confinement. That is, as the difference in refractive index from the cladding layer increases, and the layer thickness d1 of the n-type AlGaAs low-refractive-index layer 12 increases, the peak position of light confinement can be displaced toward the p-type AlGaAs cladding layer 4 side and the value of light confinement at the peak position can be increased, and it is thereby possible to determine the amount of $$\sqrt{n_c^2 - n_1^2} d_l$$

as an index when the n-type AlGaAs low-refractive-index layer 12 is inserted. When the low-refractive-index layer is inserted into the n-type cladding layer side and the p-type cladding layer side, the magnitude of the value will be defined hereinafter.

In the present embodiment, the active layer 11 is disposed at a position where the light confinement of the active layer 11 becomes smaller compared to a case with a symmetric structure in which the active layer 11 is disposed at the center of the light guide layer 3 while there is no n-type AlGaAs low-refractive-index layer 12. For example, in a case where the Al composition ratio x of the n-type AlGaAs low-refractive-index layer 12 is 0.35 and the layer thickness d1 is 200 nm, if the active layer 11 is disposed from point A (+174 nm) where the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase the slope efficiency. As a result, it is possible to reduce an operating current during high output power and improve the power conversion efficiency.

Figure 7:
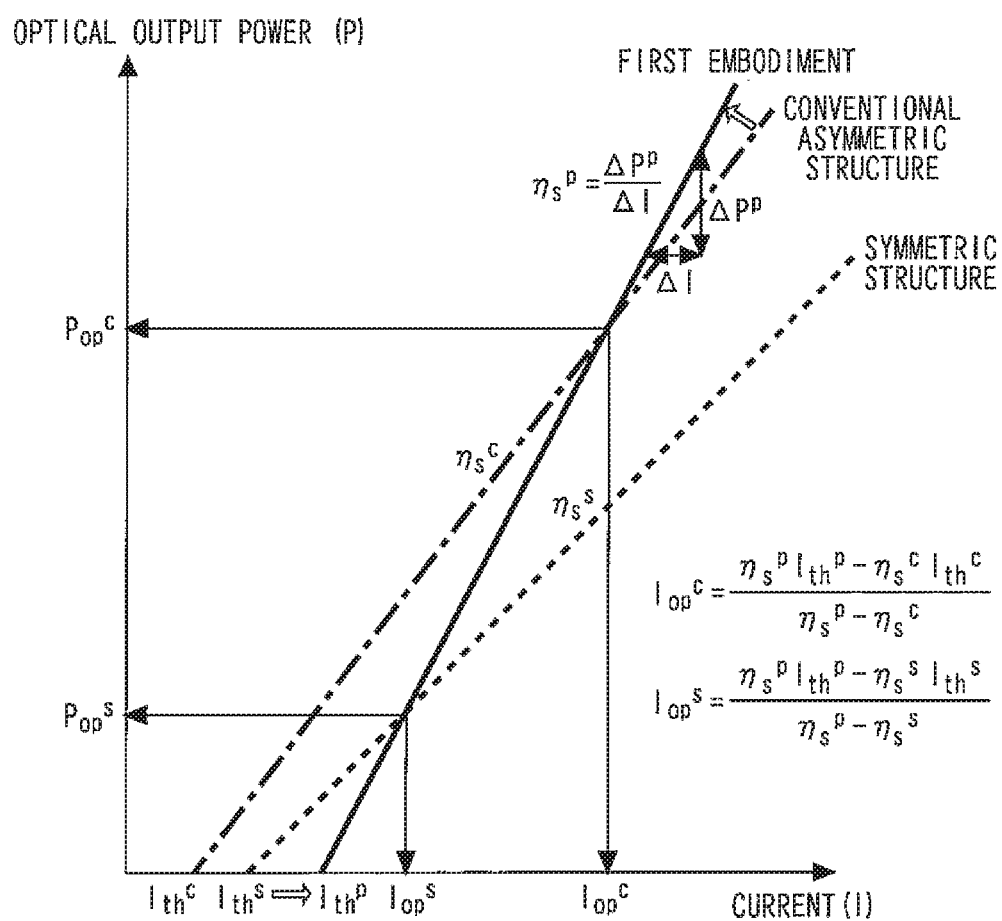
FIG. 7 is a diagram illustrating a P-I characteristic of the semiconductor laser device according to the first embodiment of the present invention.

FIG. 7 is a diagram illustrating a P-I characteristic of the semiconductor laser device according to the first embodiment of the present invention. A solid line shows a characteristic of the first embodiment, a broken line shows a characteristic of the symmetric structure, and a single-dot dashed line shows a characteristic of the conventional asymmetric structure. A threshold current ($I_{th}^P$) of the first embodiment is higher than a threshold current ($I_{th}^s$) of the symmetric structure and a threshold current ($I_{th}^c$) of the conventional asymmetric structure. However, slope efficiency ($\eta_s^P$) can be made much higher than the value ($\eta_s^s$) of the symmetric structure and the value ($\eta_s^c$) of the conventional asymmetric structure. As a result, in a region where the operating current is greater than $(\eta_s^P I_{th}^P - \eta_s^s I_{th}^s)/(\eta_s^P - \eta_s^s)$, the operating current can be made lower than that in the symmetric structure. Furthermore, in a region where the operating current is greater than $(\eta_s^P I_{th}^P - \eta_s^c I_{th}^c)/(\eta_s^P - \eta_s^c)$, the operating current can be made lower than that in the conventional asymmetric structure. Therefore, the semiconductor laser device according to the present embodiment can reduce the operating current during large output power, and can thereby increase power conversion efficiency ($\eta_e$) defined by optical output power (Pop) with respect to injected power (Vop·Iop).

Second Embodiment

Figure 8:
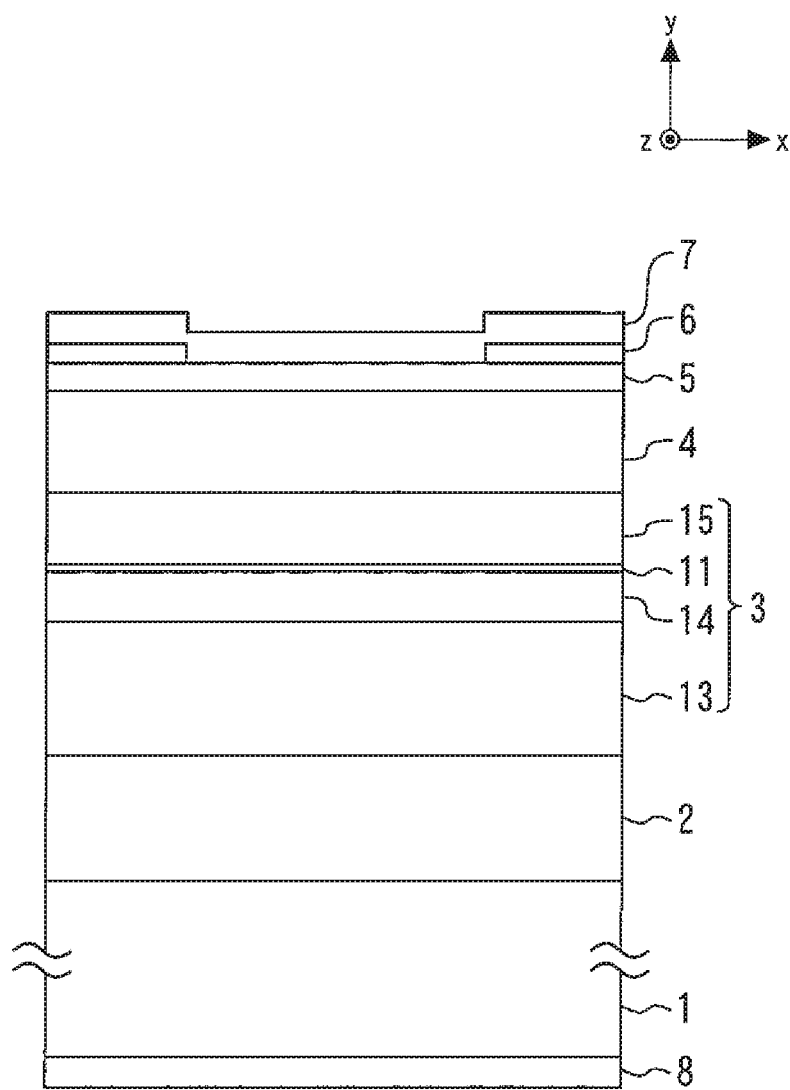
FIG. 8 is a cross-sectional view illustrating a semiconductor laser device according to a second embodiment of the present invention.

FIG. 8 is a cross-sectional view illustrating a semiconductor laser device according to a second embodiment of the present invention. The light guide layer 3 of the present embodiment includes a first light guide layer 13 formed on the n-type AlGaAs cladding layer 2, and second light guide layers 14 and 15 formed on the first light guide layer 13. The active layer 11 is formed between the second light guide layers 14 and 15. The first light guide layer 13 is AlGaAs having an Al composition ratio of 0.210. The second light guide layers 14 and 15 are AlGaAs having the same Al composition ratio of 0.190. The sum of a layer thickness dn2 of the second light guide layer 14 and a layer thickness dp of the second light guide layer 15 is 450 nm and is smaller than a layer thickness 750 nm of the first light guide layer 13.

The sum of layer thicknesses of the first light guide layer 13 and the second light guide layers 14 and 15 is 1200 nm. Note that the refractive index of AlGaAs having an Al composition ratio of 0.190 with respect to light having a wavelength of 915 nm is 3.4327. There is no n-type AlGaAs low-refractive-index layer 12. The rest of the configuration is similar to that of the first embodiment.

Figure 9:
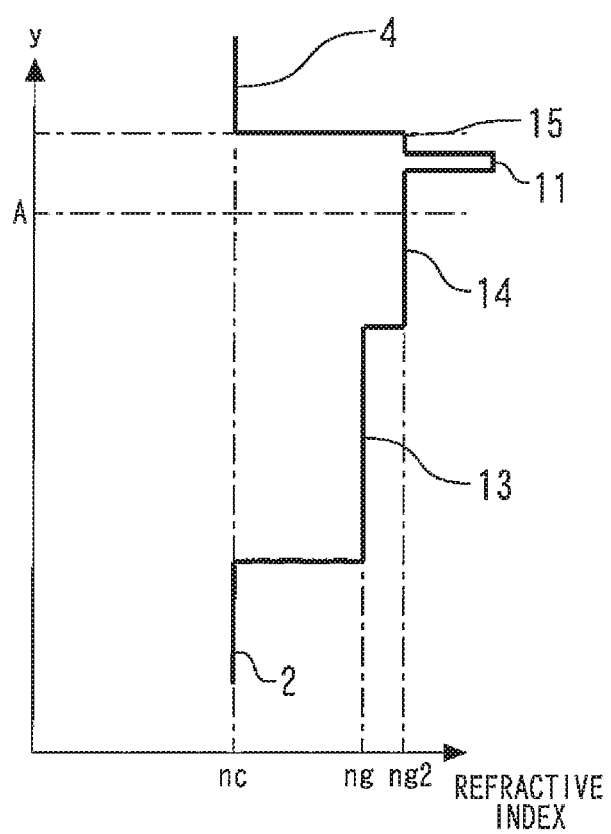
FIG. 9 is a diagram illustrating a refractive index distribution along a crystal growing direction in the vicinity of the active layer of the semiconductor laser device according to the second embodiment of the present invention.

FIG. 9 is a diagram illustrating a refractive index distribution along a crystal growing direction in the vicinity of the active layer of the semiconductor laser device according to the second embodiment of the present invention. A refractive index ng2 of the second light guide layers 14 and 15 is higher than a refractive index ng of the first light guide layer 13. For this reason, a normalized frequency v functions in a direction in which it increases. When both refractive indexes are equal, since the normalized frequency v is greater than π/2, the normalized frequency v of the present structure also exceeds π/2 constituting a structure in which a high-order mode is permissible in the crystal growing direction. When two n-side light guide layers are provided in this way, π/2≤v needs to be satisfied as a condition for permitting a high-order mode as well.

Figure 10:
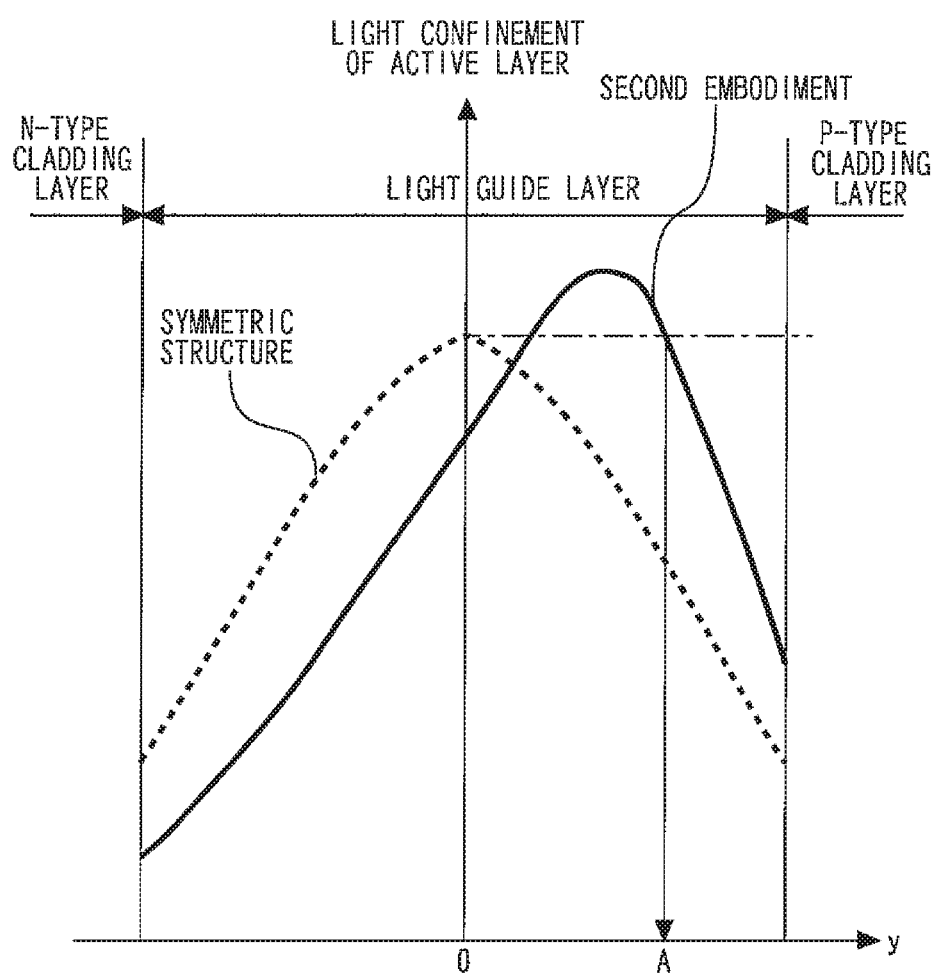
FIG. 10 is a diagram illustrating active layer positional dependency of light confinement of the active layer in the semiconductor laser device according to the second embodiment of the present invention.

FIG. 10 is a diagram illustrating active layer positional dependency of light confinement of the active layer in the semiconductor laser device according to the second embodiment of the present invention. When the active layer 11 is disposed from point A (+373 nm) where the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase the slope efficiency. Thus, the present embodiment disposes the active layer 11 at a position where light confinement of the active layer 11 becomes smaller compared to the symmetric structure in which the refractive indexes of the first light guide layer 13 and the second light guide layers 14 and 15 are the same and the active layer 11 is disposed at the center of the light guide layer 3. As a result, it is possible to reduce an operating current during high output power and improve the power conversion efficiency.

Third Embodiment

Figure 11:
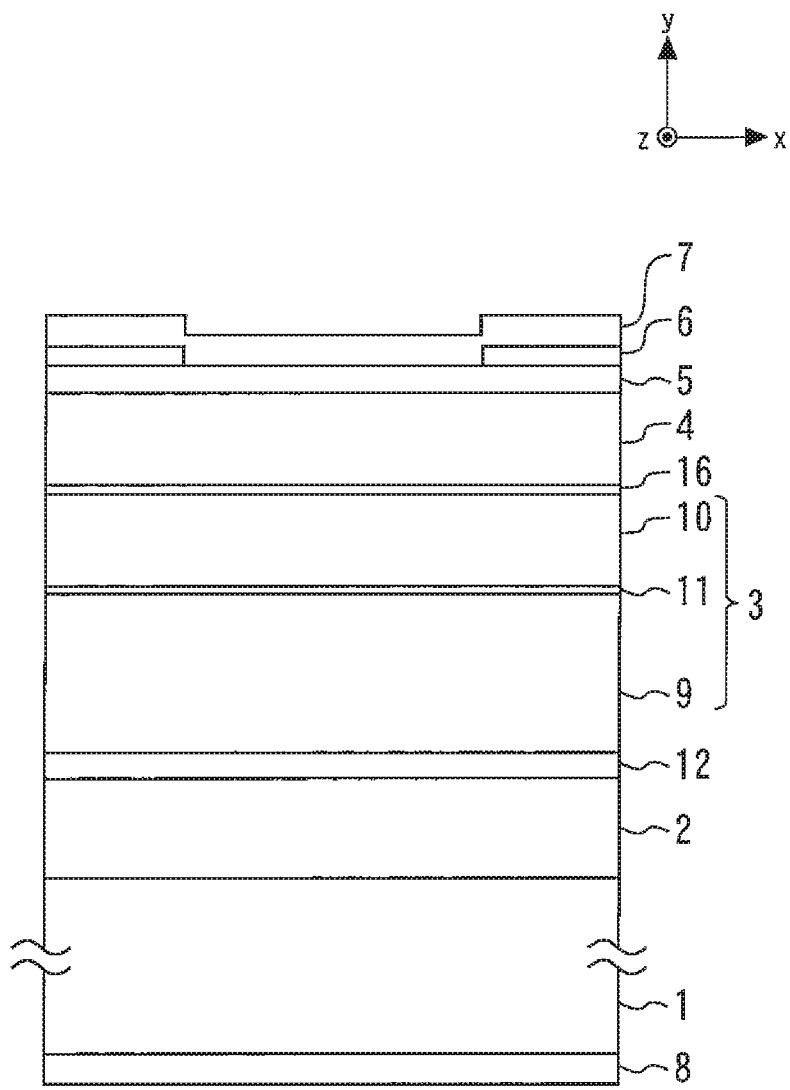
FIG. 11 is a cross-sectional view illustrating a semiconductor laser device according to a third embodiment of the present invention.

FIG. 11 is a cross-sectional view illustrating a semiconductor laser device according to a third embodiment of the present invention. A p-type AlGaAs low-refractive-index layer 16 having an Al composition ratio of 0.600 and a layer thickness of 40 nm is formed between the light guide layer 3 and the p-type AlGaAs cladding layer 4. The rest of the configuration is similar to that of the first embodiment.

Figure 12:
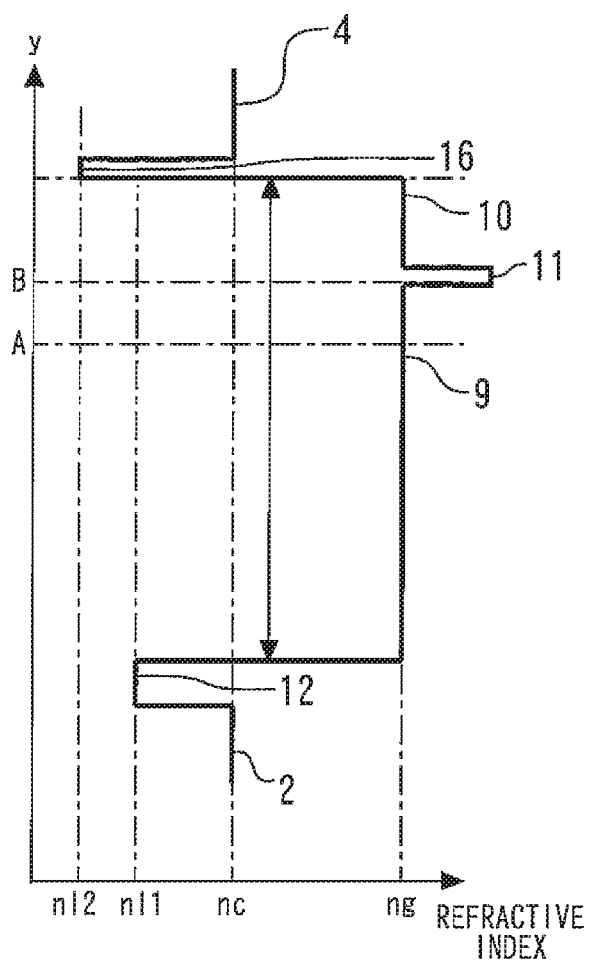
FIG. 12 is a diagram illustrating a refractive index distribution along a crystal growing direction in the vicinity of the active layer of the semiconductor laser device according to the third embodiment of the present invention.

FIG. 12 is a diagram illustrating a refractive index distribution along a crystal growing direction in the vicinity of the active layer of the semiconductor laser device according to the third embodiment of the present invention. The p-type AlGaAs low-refractive-index layer 16 has a lower refractive index nl2 than the refractive index nc of the p-type AlGaAs cladding layer 4. Note that the refractive index of AlGaAs having an Al composition ratio of 0.600 with respect to light having a wavelength of 915 nm is 3.1846.

As described in the first embodiment, the insertion of the p-type AlGaAs low-refractive-index layer 16 has a function of displacing a light intensity distribution to the opposite side of the insertion position across the active layer 11. The amount of displacement can be determined using the layer thickness and the refractive index nl2 of the p-type AlGaAs low-refractive-index layer 16 and the refractive index nc of the p-type AlGaAs cladding layer 4 as indices.

From the necessity to displace the peak position of light confinement from the center of the light guide layer 3 to the p-type AlGaAs cladding layer 4 side, it may be possible to set the refractive index of the n-type AlGaAs low-refractive-index layer 12 to nl1, the layer thickness of the n-type AlGaAs low-refractive-index layer 12 to dl1, the refractive index of the p-type AlGaAs low-refractive-index layer 16 to nl2 and the layer thickness of the p-type AlGaAs low-refractive-index layer 16 to dl2 so as to satisfy equation (2).

$$\sqrt{n_c^2 - n_{l1}^2} d_{l1} > \sqrt{n_c^2 - n_{l2}^2} d_{l2} \quad (2)$$

Figure 13:
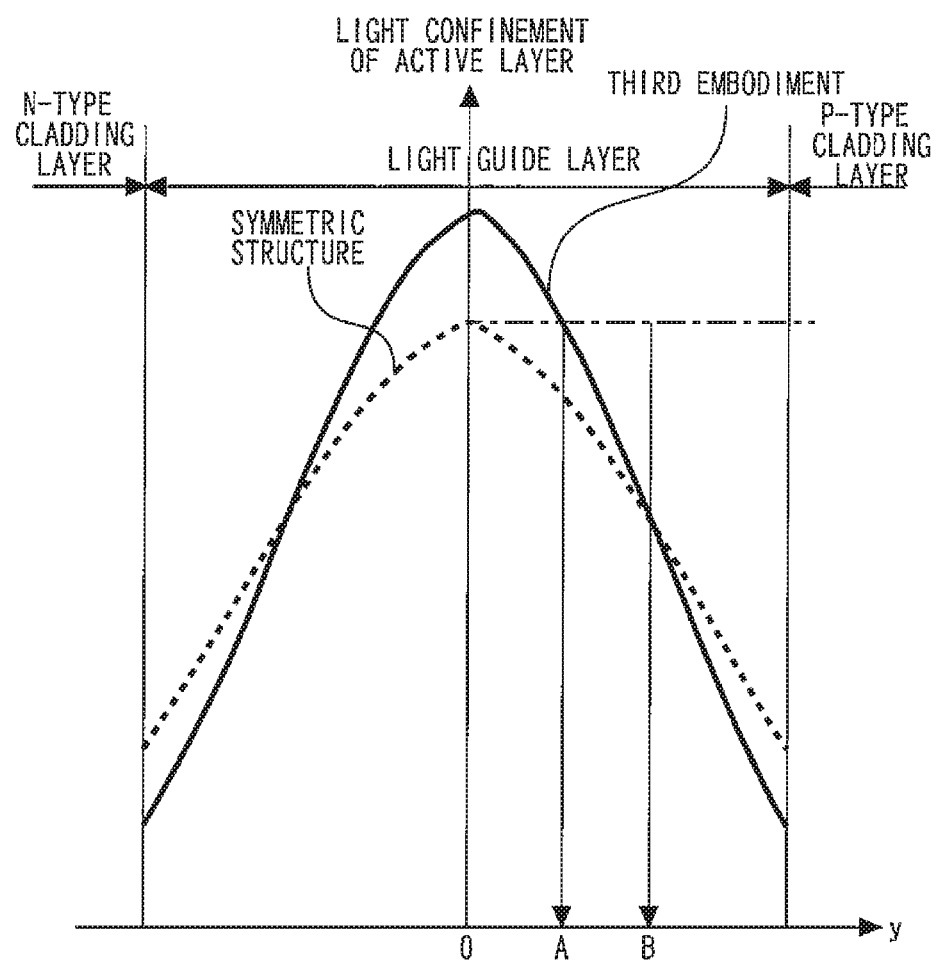
FIG. 13 is a diagram illustrating active layer positional dependency of light confinement of the active layer of the semiconductor laser device according to the third embodiment of the present invention.

FIG. 13 is a diagram illustrating active layer positional dependency of light confinement of the active layer of the semiconductor laser device according to the third embodiment of the present invention. When the active layer 11 is disposed from point A (+177 nm) at which the light confinement value becomes the same as that at the center of the light guide layer 3 of the symmetric structure to a position of an end of the p-side light guide layer (+600 nm), it is possible to reduce light absorption by carriers in the light guide layer compared to the symmetric structure and the conventional asymmetric structure, and thereby increase slope efficiency. As a result, it is possible to reduce an operating current during high output power and improve the power conversion efficiency.

Note that when the active layer 11 is disposed between a point of intersection B (+341 nm) with light confinement of the symmetric structure and point A, it is possible to reduce a threshold current compared to a case where the active layer 11 is disposed in the section of the symmetric structure.

Fourth Embodiment

Figure 14:
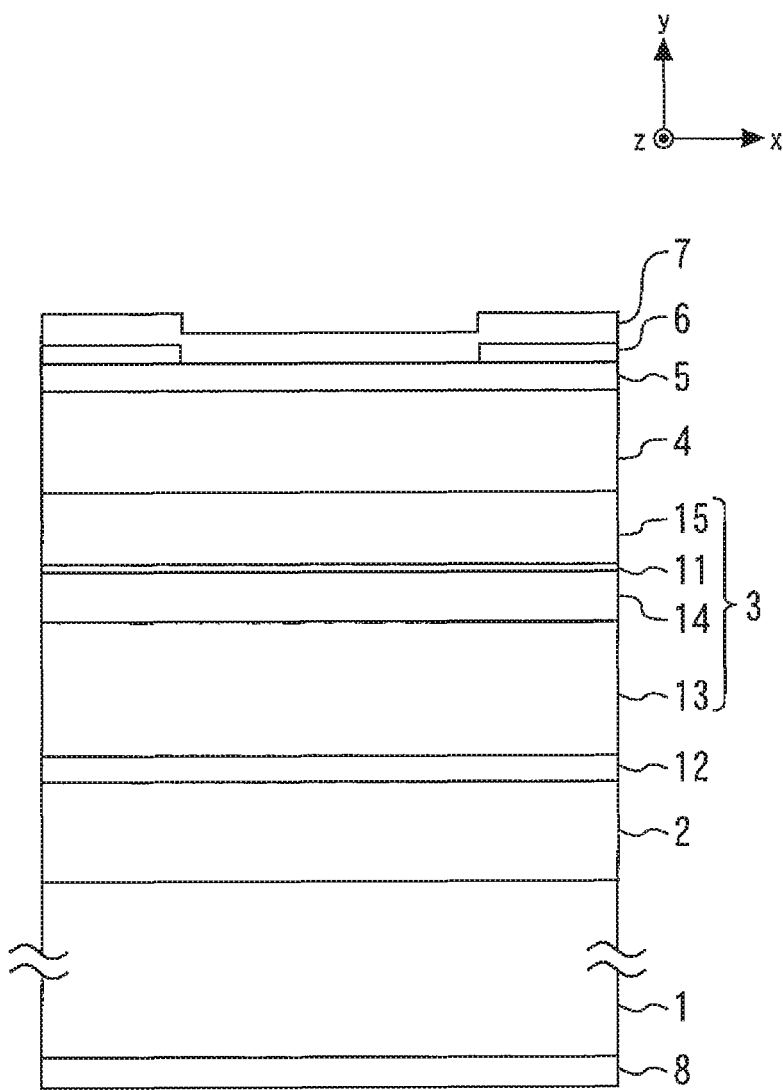
FIG. 14 is a cross-sectional view illustrating a semiconductor laser device according to a fourth embodiment of the present invention.
Figure 15:
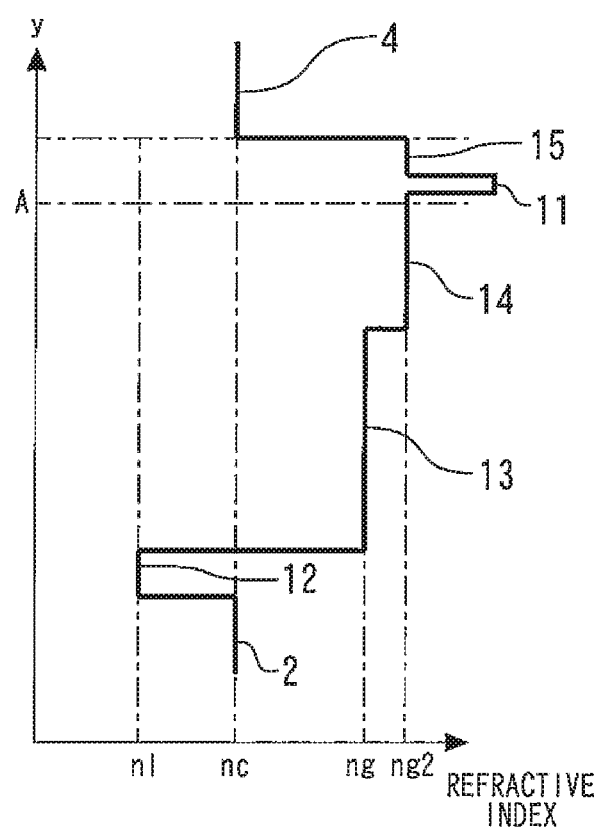
FIG. 15 is a diagram illustrating a refractive index distribution along a crystal growing direction in the vicinity of an active layer of the semiconductor laser device according to the fourth embodiment of the present invention.

FIG. 14 is a cross-sectional view illustrating a semiconductor laser device according to a fourth embodiment of the present invention. FIG. 15 is a diagram illustrating a refractive index distribution along a crystal growing direction in the vicinity of an active layer of the semiconductor laser device according to the fourth embodiment of the present invention. The n-type AlGaAs low-refractive-index layer 12 having an Al composition ratio of 0.350 and a layer thickness of 200 nm is formed between the n-type AlGaAs cladding layer 2 and the light guide layer 3. The rest of the configuration is similar to that of the second embodiment.

Figure 16:
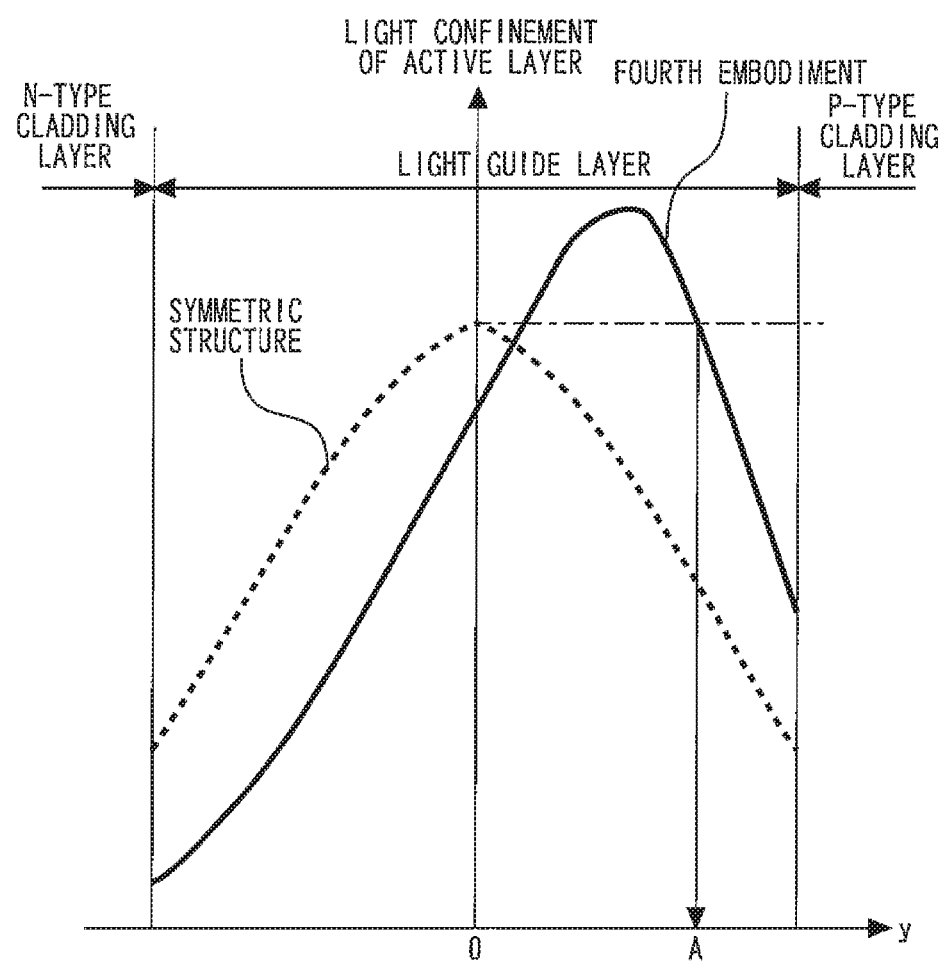
FIG. 16 is a diagram illustrating active layer positional dependency of light confinement of the active layer of the semiconductor laser device according to the fourth embodiment of the present invention.

FIG. 16 is a diagram illustrating active layer positional dependency of light confinement of the active layer of the semiconductor laser device according to the fourth embodiment of the present invention. When the active layer 11 is disposed from point A (+415 nm) at which the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase slope efficiency. As a result, it is possible to reduce an operating current during high output power and improve the power conversion efficiency.

Fifth Embodiment

Figure 17:
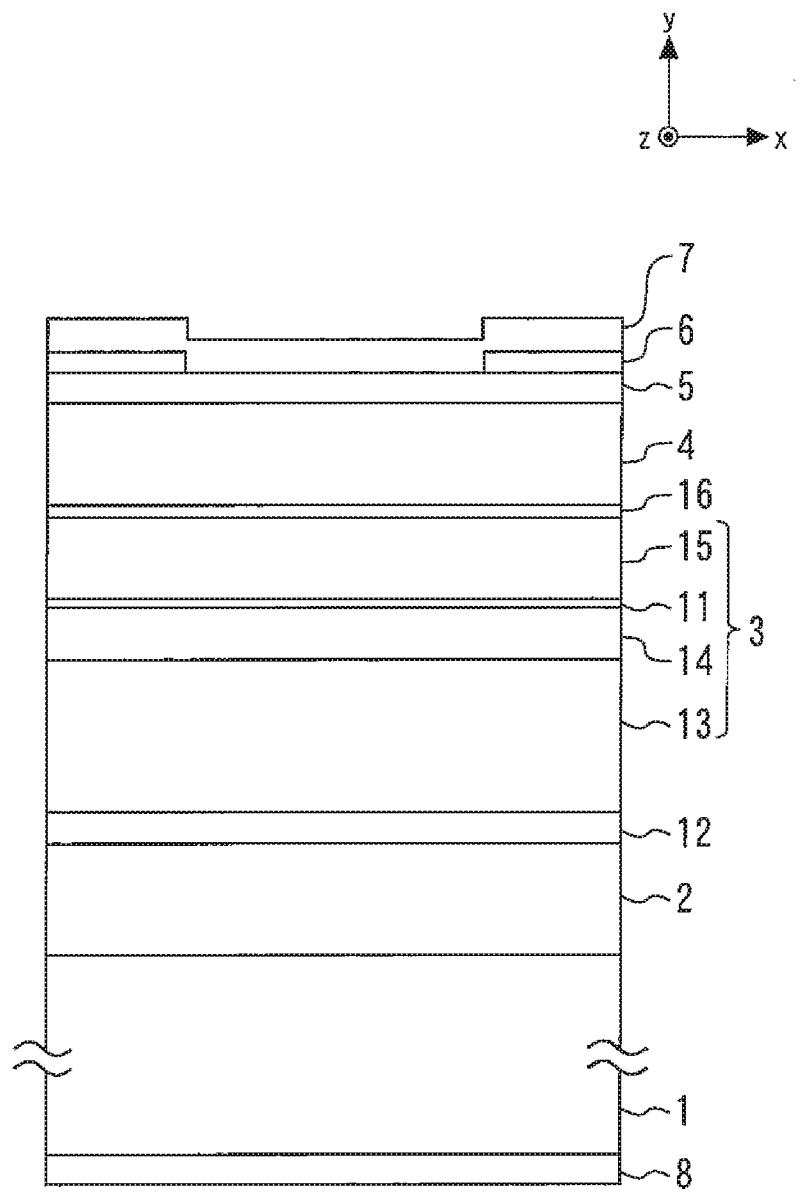
FIG. 17 is a cross-sectional view illustrating a semiconductor laser device according to a fifth embodiment of the present invention.

FIG. 17 is a cross-sectional view illustrating a semiconductor laser device according to a fifth embodiment of the present invention. A p-type AlGaAs low-refractive-index layer 16 having an Al composition ratio of 0.600 and a layer thickness of 40 nm is formed between the light guide layer 3 and the p-type AlGaAs cladding layer 4. The rest of the configuration is similar to that of the fourth embodiment.

Figure 18:
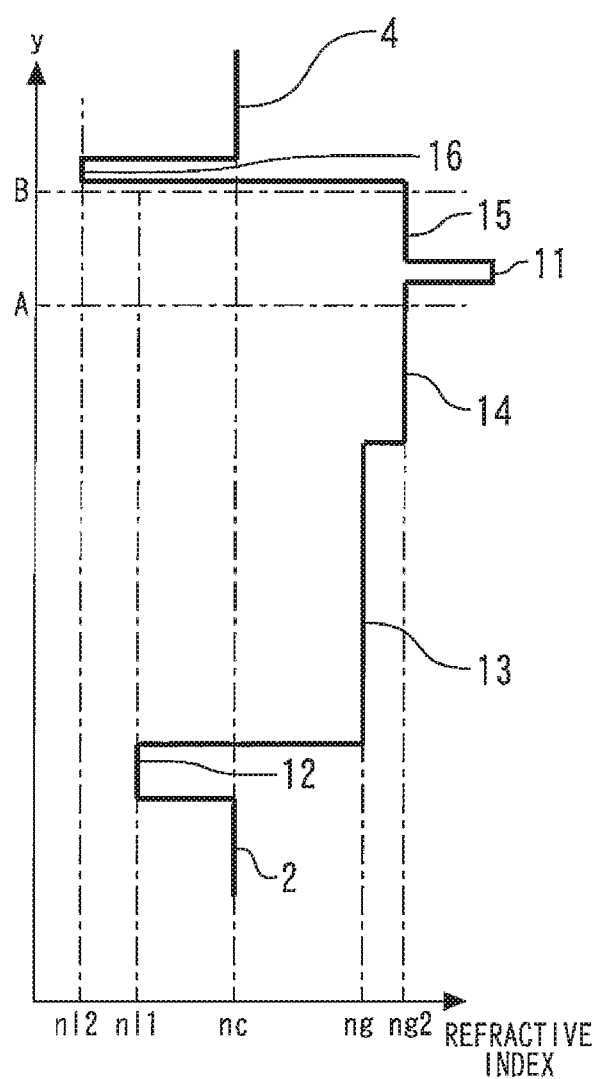
FIG. 18 is a diagram illustrating a refractive index distribution along a crystal growing direction in the vicinity of an active layer of the semiconductor laser device according to the fifth embodiment of the present invention.

FIG. 18 is a diagram illustrating a refractive index distribution along a crystal growing direction in the vicinity of an active layer of the semiconductor laser device according to the fifth embodiment of the present invention. The p-type AlGaAs low-refractive-index layer 16 has a refractive index nl2 lower than the refractive index nc of the p-type AlGaAs cladding layer 4. Equation (2) needs to be satisfied here as in the case of the third embodiment.

Figure 19:
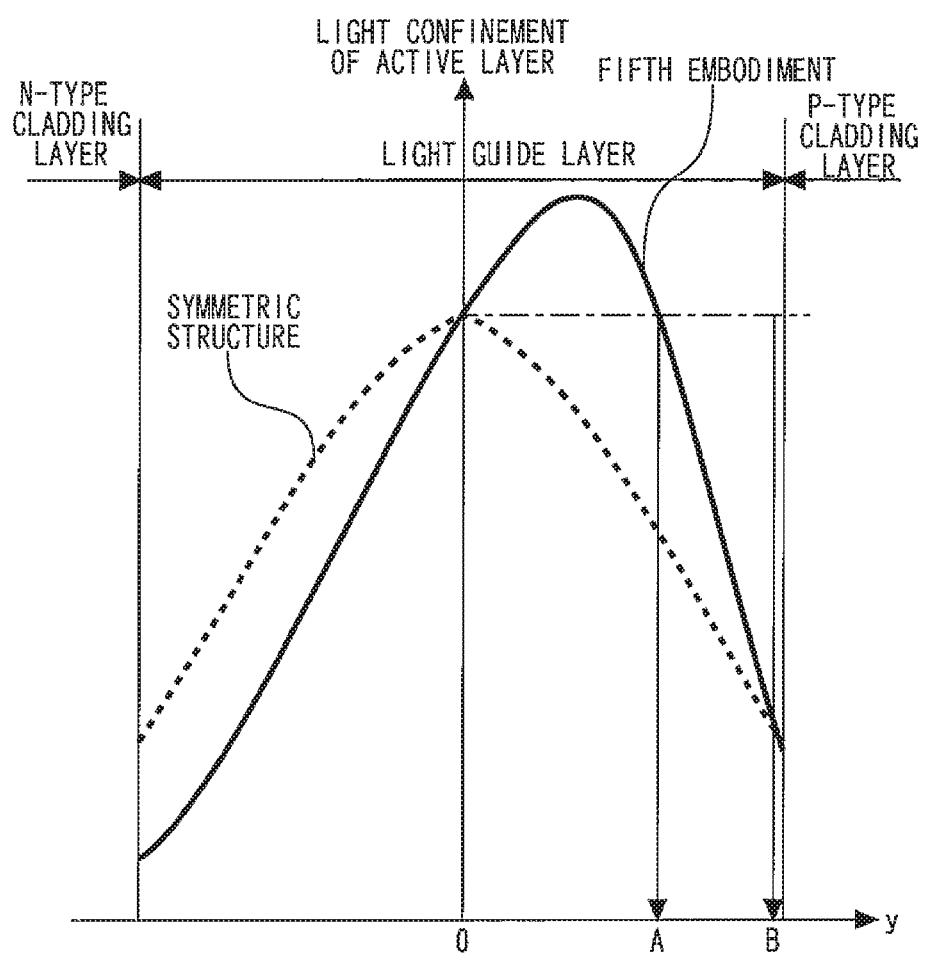
FIG. 19 is a diagram illustrating active layer positional dependency of light confinement of the active layer of the semiconductor laser device according to the fifth embodiment of the present invention.

FIG. 19 is a diagram illustrating active layer positional dependency of light confinement of the active layer of the semiconductor laser device according to the fifth embodiment of the present invention. When the active layer 11 is disposed from point A (+359 nm) where the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase the slope efficiency. As a result, it is possible to reduce an operating current during high output power and improve the power conversion efficiency.

Note that when the active layer 11 is disposed between a point of intersection B (+579 nm) with light confinement of the symmetric structure and point A, it is possible to reduce a threshold current compared to a case where the active layer 11 is disposed in the section of the symmetric structure.

Sixth Embodiment

Figure 20:
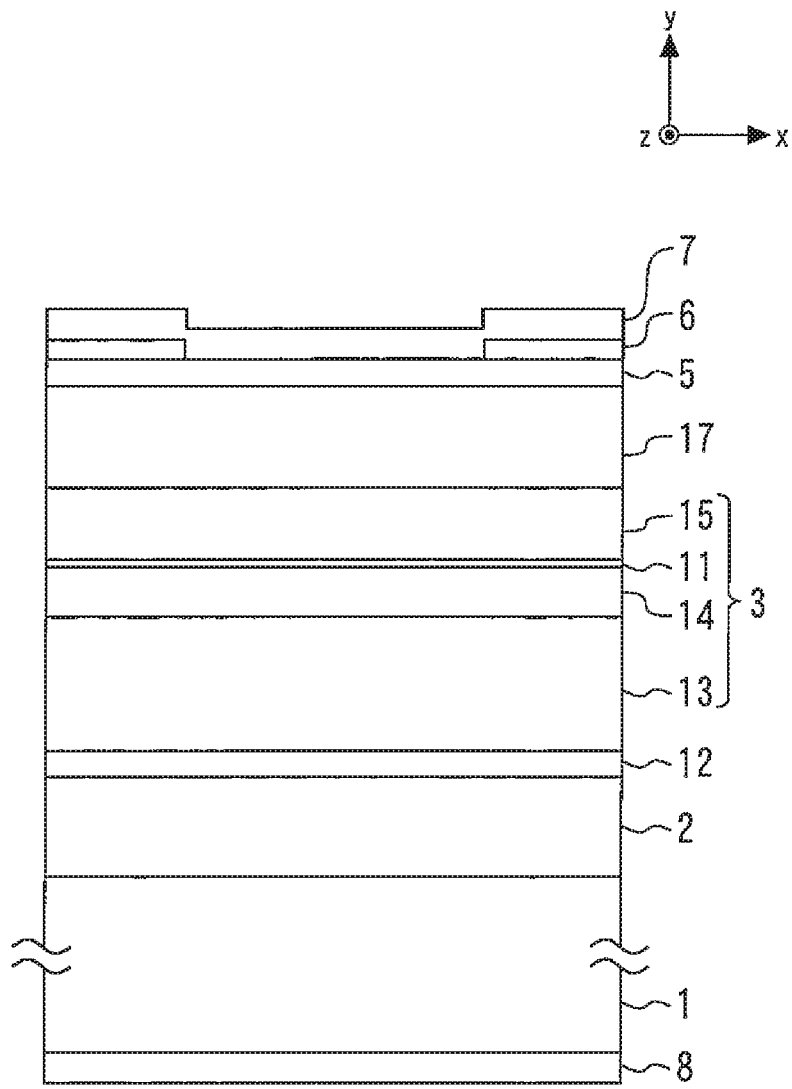
FIG. 20 is a cross-sectional view illustrating a semiconductor laser device according to a sixth embodiment of the present invention.
Figure 21:
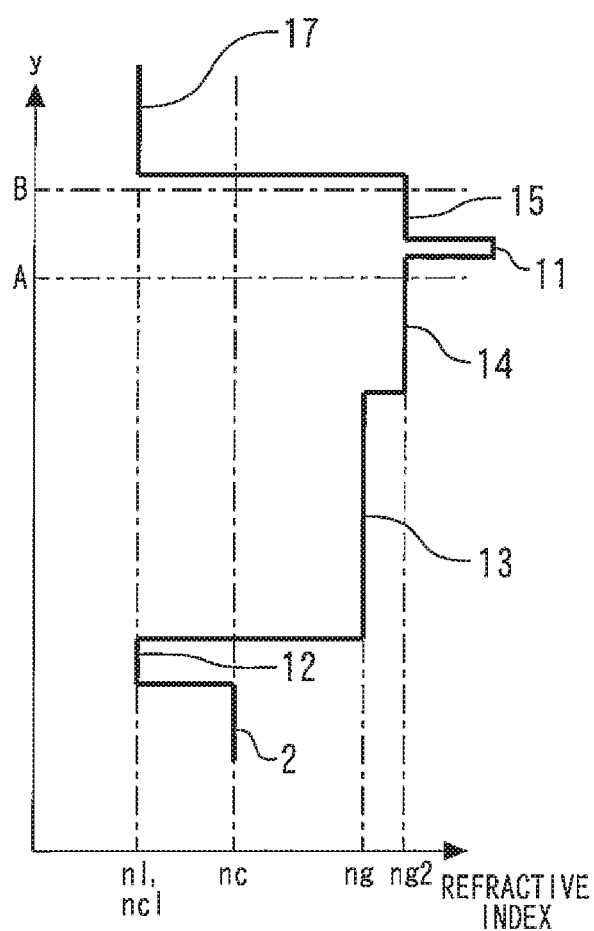
FIG. 21 is a diagram illustrating a refractive index distribution along a crystal growing direction in the vicinity of an active layer of the semiconductor laser device according to the sixth embodiment of the present invention.

FIG. 20 is a cross-sectional view illustrating a semiconductor laser device according to a sixth embodiment of the present invention. FIG. 21 is a diagram illustrating a refractive index distribution along a crystal growing direction in the vicinity of an active layer of the semiconductor laser device according to the sixth embodiment of the present invention. A p-type AlGaAs cladding layer 17 having an Al composition ratio of 0.350 and a layer thickness of 1. 5 μm is provided instead of the p-type AlGaAs cladding layer 4. The rest of the configuration is similar to that of the fourth embodiment. Since increasing the Al composition ratio of the p-type AlGaAs cladding layer 17 and decreasing a refractive index corresponds to a direction in which the normalized frequency is increased, the present embodiment also provides a structure in which a high-order mode equal to or higher than the first-order mode is permissible.

Figure 22:
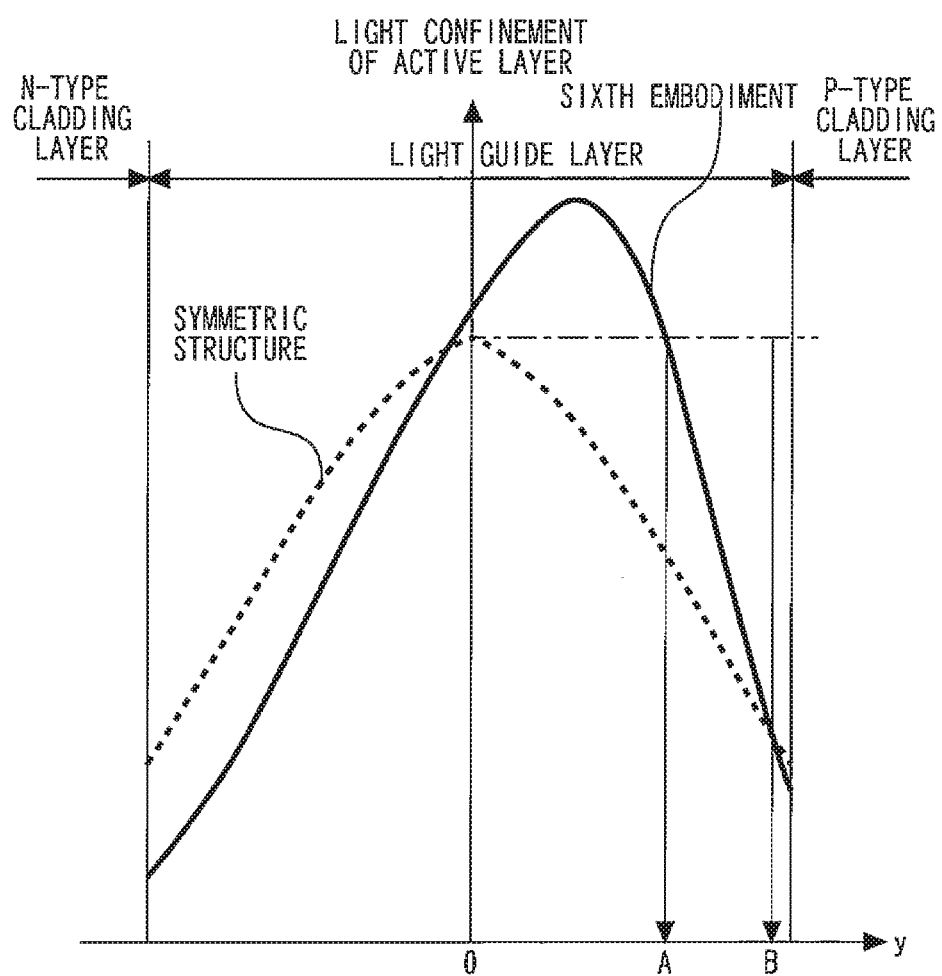
FIG. 22 is a diagram illustrating active layer positional dependency of light confinement of an active layer of the semiconductor laser device according to the sixth embodiment of the present invention.

FIG. 22 is a diagram illustrating active layer positional dependency of light confinement of an active layer of the semiconductor laser device according to the sixth embodiment of the present invention. When the active layer 11 is disposed from point A (+365 nm) where the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase the slope efficiency. In the present embodiment, the active layer 11 is disposed at a position at which refractive indexes of the first light guide layer 13 and the second light guide layers 14 and 15 are the same and refractive indexes of the n-type AlGaAs cladding layer 2 and the p-type AlGaAs cladding layer 17 are the same while there is no n-type AlGaAs low-refractive-index layer 12, and the light confinement of the active layer 11 is smaller than that in the symmetric structure in which the active layer 11 is disposed at the center of the light guide layer 3. As a result, it is possible to reduce an operating current during high output power and improve the power conversion efficiency.

Note that when the active layer 11 is disposed between a point of intersection B (+566 nm) with light confinement of the symmetric structure and point A, it is possible to reduce a threshold current compared to a case where the active layer 11 is disposed in the section of the symmetric structure.

Seventh Embodiment

Figure 23:
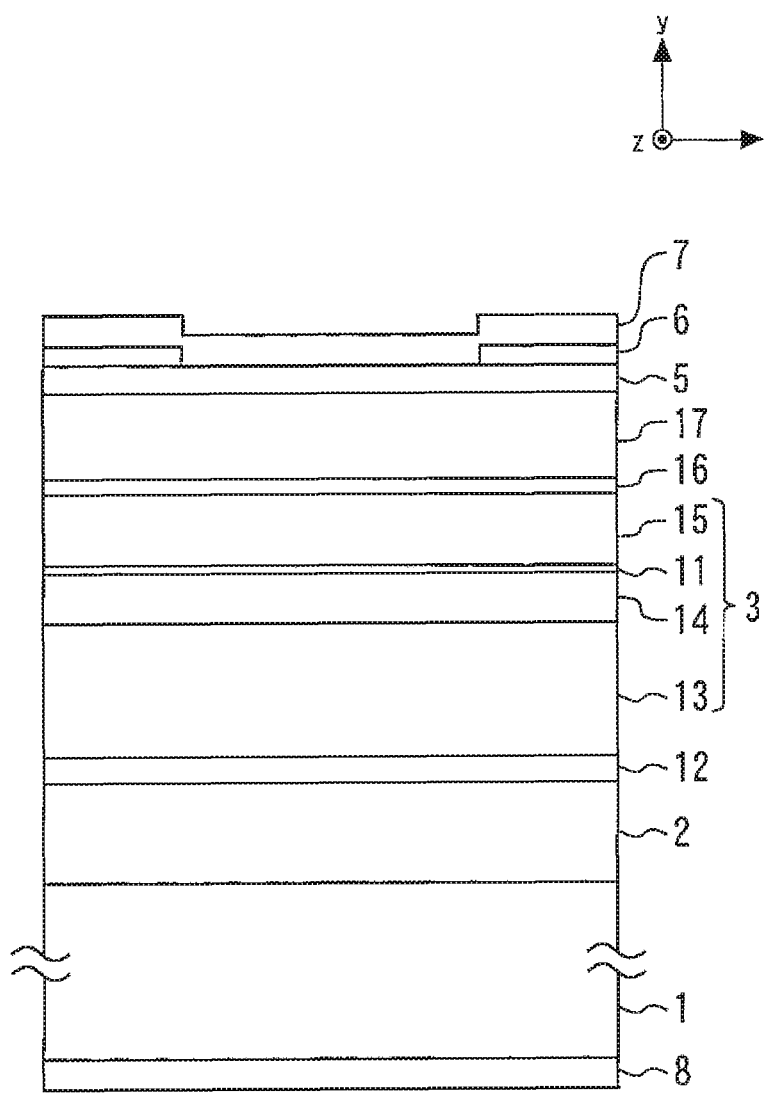
FIG. 23 is a cross-sectional view illustrating a semiconductor laser device according to a seventh embodiment of the present invention.

FIG. 23 is a cross-sectional view illustrating a semiconductor laser device according to a seventh embodiment of the present invention. The p-type AlGaAs low-refractive-index layer 16 having an Al composition ratio of 0.600 and a layer thickness of 40 nm is formed between the light guide layer 3 and the p-type AlGaAs cladding layer 17. The rest of the configuration is similar to that of the sixth embodiment.

Figure 24:
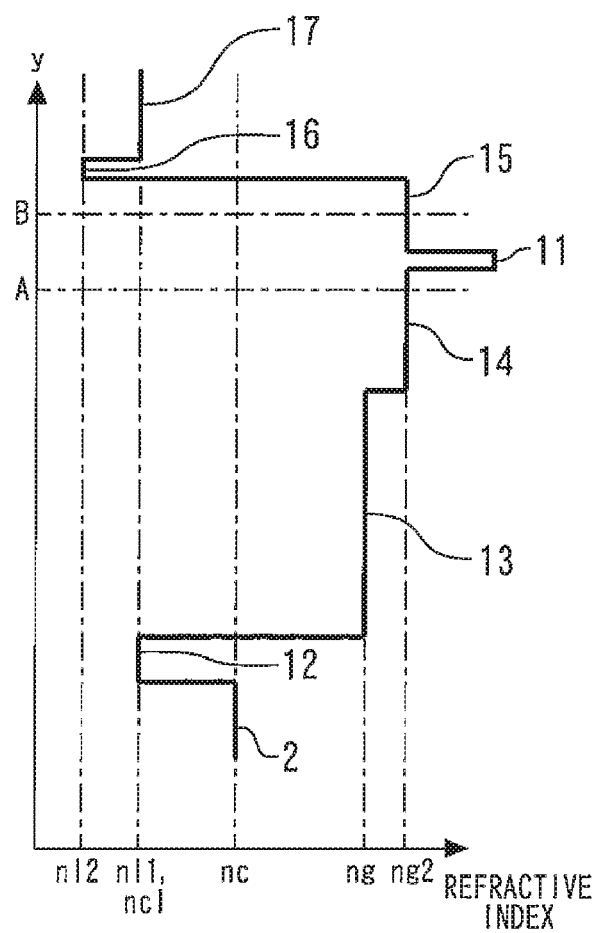
FIG. 24 is a diagram illustrating a refractive index distribution along a crystal growing direction in the vicinity of an active layer of the semiconductor laser device according to the seventh embodiment of the present invention.

FIG. 24 is a diagram illustrating a refractive index distribution along a crystal growing direction in the vicinity of an active layer of the semiconductor laser device according to the seventh embodiment of the present invention. The p-type AlGaAs low-refractive-index layer 16 has a refractive index nl2 lower than a refractive index ncl of the p-type AlGaAs cladding layer 17.

Equation (2) needs to be satisfied as in the case of the third embodiment assuming that the refractive index of the n-type AlGaAs low-refractive-index layer 12 is nl1, the layer thickness of the n-type AlGaAs low-refractive-index layer 12 is dl1, the refractive index of the p-type AlGaAs low-refractive-index layer 16 is nl2 and the layer thickness of the p-type AlGaAs low-refractive-index layer 16 is dl2.

Figure 25:
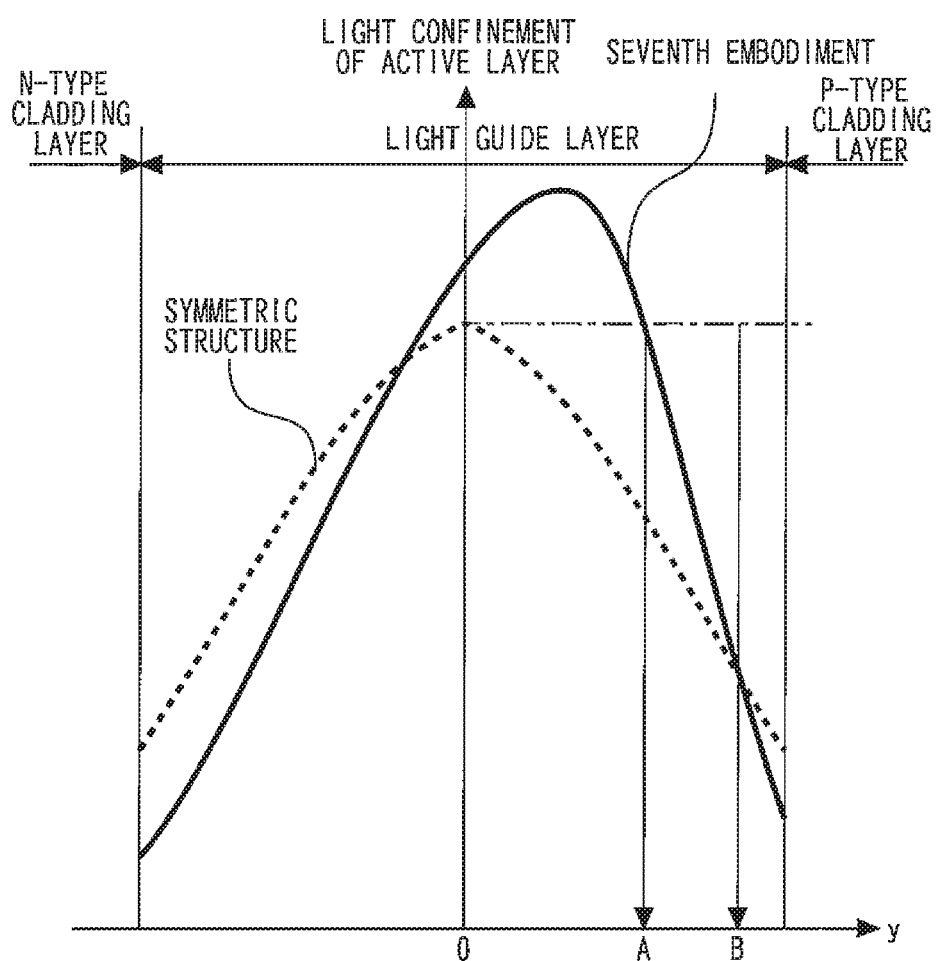
FIG. 25 is a diagram illustrating active layer positional dependency of light confinement of an active layer of the semiconductor laser device according to the seventh embodiment of the present invention.

FIG. 25 is a diagram illustrating active layer positional dependency of light confinement of an active layer of the semiconductor laser device according to the seventh embodiment of the present invention. When the active layer 11 is disposed from point A (+336 nm) where the light confinement value becomes the same as that at the center of the light guide layer 3 of the symmetric structure to a position of an end of the p-side light guide layer (+600 nm), it is possible to reduce light absorption by carriers in the light guide layer 3 compared to the symmetric structure and the conventional asymmetric structure, and thereby increase the slope efficiency. As a result, it is possible to reduce an operating current during high output power and improve the power conversion efficiency.

Note that when the active layer 11 is disposed between a point of intersection B (+510 nm) with light confinement of the symmetric structure and point A, it is possible to reduce a threshold current compared to a case where the active layer 11 is disposed in the section of the symmetric structure.

Eighth Embodiment

Figure 26:
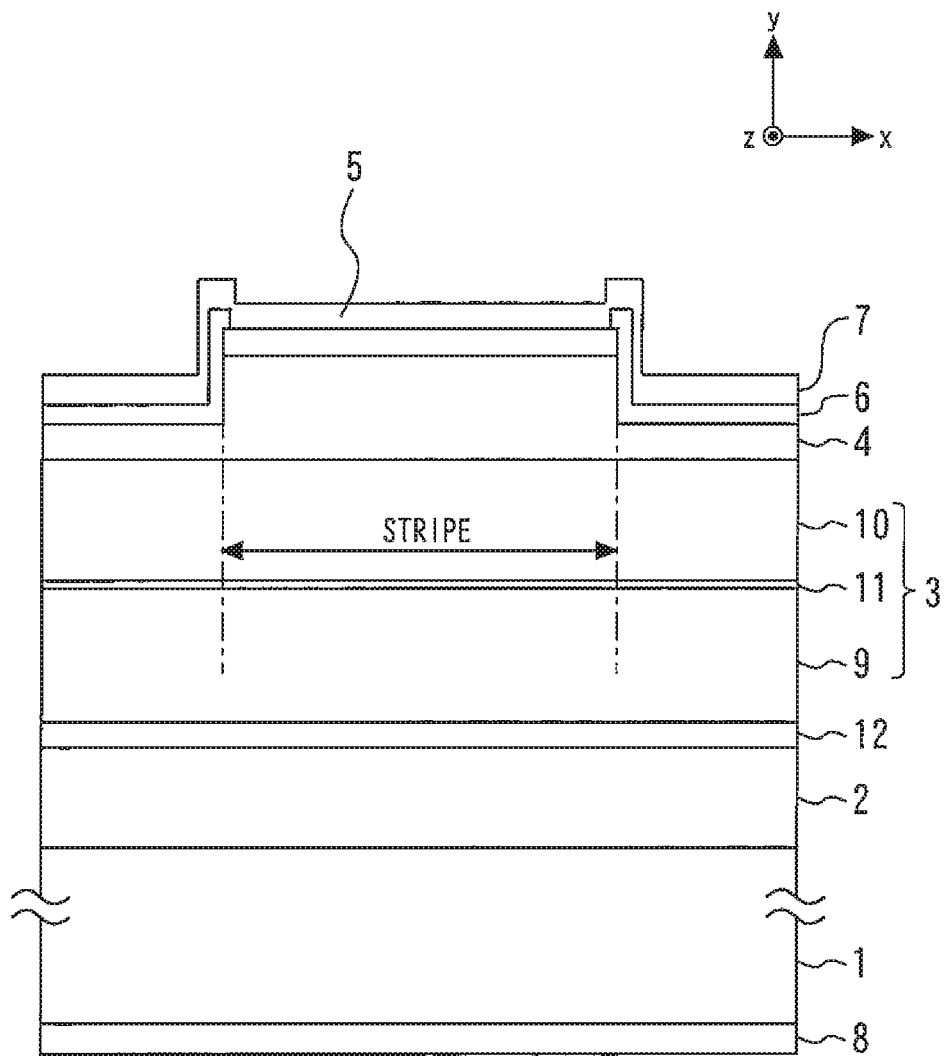
FIG. 26 is a cross-sectional view illustrating a semiconductor laser device according to an eighth embodiment of the present invention.

FIG. 26 is a cross-sectional view illustrating a semiconductor laser device according to an eighth embodiment of the present invention. The semiconductor laser device according to the present embodiment is a ridge type laser having a ridge structure formed by removing, through etching, the p-type AlGaAs cladding layer 4 up to a midpoint. The rest of the configuration is similar to that of the first embodiment.

Since the configuration of the present embodiment can suppress expansion of an x-direction current in the p-type AlGaAs cladding layer 4, and can thereby cause the current to concentrate in a stripe. This makes it possible to narrow a gain reducing region at both ends of the stripe due to a reduction in current density and further improve slope efficiency. Note that the configuration of the present embodiment is not limited to the first embodiment but can also be applied to the semiconductor laser devices of the second to seventh embodiments.

Ninth Embodiment

Figure 27:
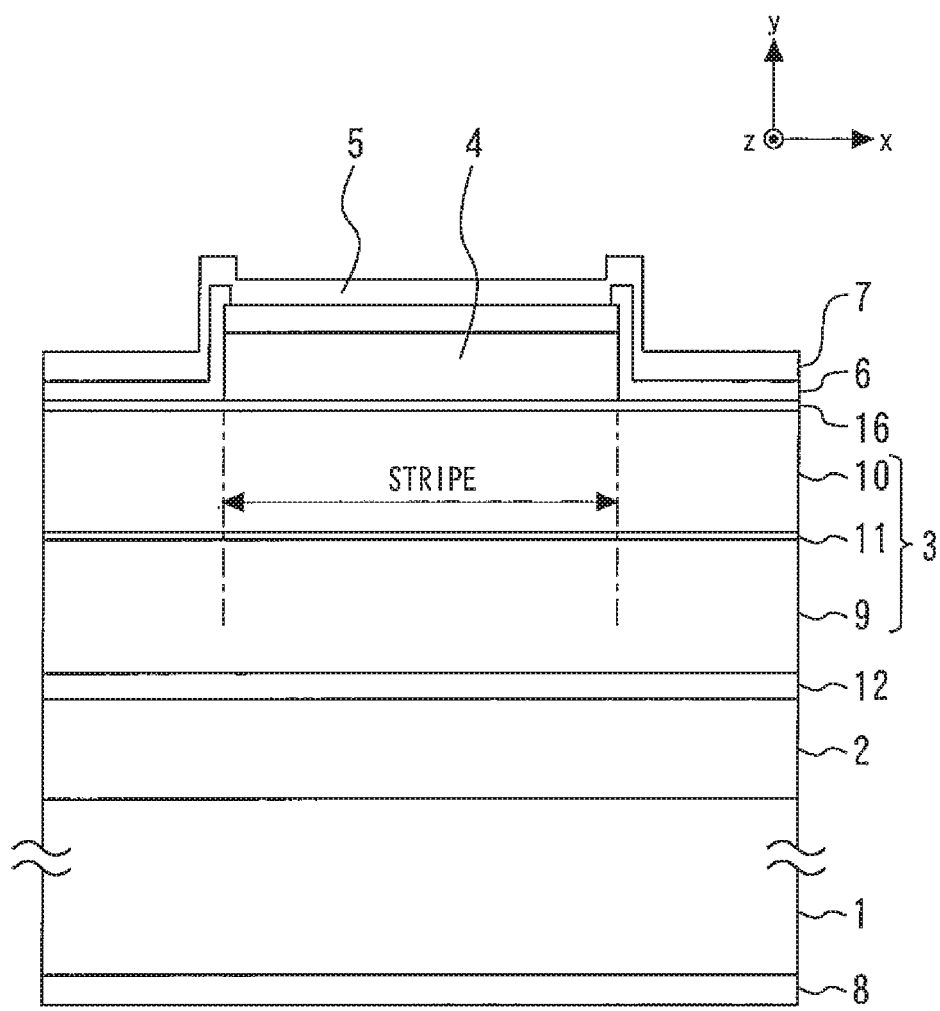
FIG. 27 is a cross-sectional view illustrating a semiconductor laser device according to a ninth embodiment of the present invention.
Figure 28:
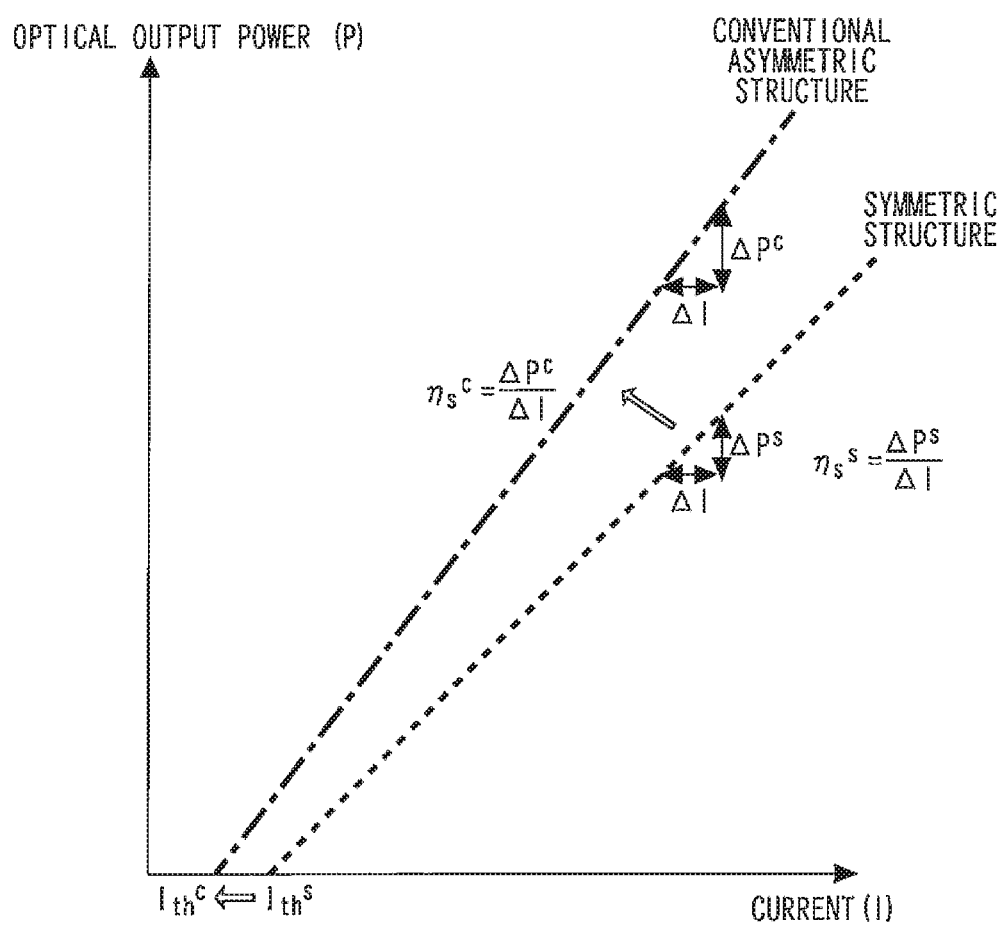
FIG. 28 is a diagram illustrating an optical output power-current (P-I) characteristic of a conventional asymmetric structure in comparison with a symmetric structure.

FIG. 27 is a cross-sectional view illustrating a semiconductor laser device according to a ninth embodiment of the present invention. The semiconductor laser device according to the present embodiment is a ridge type laser having a ridge structure formed by removing, through etching, the p-type AlGaAs cladding layer 4 up to the p-type AlGaAs low-refractive-index layer 16. The rest of the configuration is similar to that of the third embodiment. Since the p-type AlGaAs cladding layer 4 and the p-type AlGaAs low-refractive-index layer 16 have different Al composition ratios, it is possible for the p-type AlGaAs low-refractive-index layer 16 to selectively stop etching on the p-type AlGaAs cladding layer 4.

The configuration of the present embodiment limits the expansion of the x-direction current to only within the p-side AlGaAs light guide layer 10, and can thereby suppress variations of the laser characteristic. Note that the configuration of the present embodiment is not limited to the third embodiment, but can also be applied to the semiconductor laser device of the fifth or seventh embodiment.

Note that the first to ninth embodiments have been presented by way of example, and the composition and layer thickness of each layer are not limited to this. The sum d of layer thicknesses of the light guide layer 3 is assumed to be 1200 nm, but the present invention is not limited to this, and it is all right if each layer has a layer thickness in which a high-order mode is permissible.

Obviously many modifications and variations of the present invention are possible in the light of the above teachings.

It is therefore to be understood that within the scope of the appended claims the invention may be practiced otherwise than as specifically described.

The entire disclosure of Japanese Patent Application No. 2015-208271, filed on Oct. 22, 2015 including specification, claims, drawings and summary, on which the Convention priority of the present application is based, is incorporated herein by reference in its entirety.

The invention claimed is:

1. A semiconductor laser device comprising:
  a semiconductor substrate of a first conductivity type;
  a first conductivity type cladding layer on the semiconductor substrate;
  a light guide layer on the first conductivity type cladding layer;
  a second conductivity type cladding layer on the light guide layer;
  an active layer on a side closer to the second conductivity type cladding layer than a center of the light guide layer in the light guide layer; and
  a first conductivity type low-refractive-index layer formed between the first conductivity type cladding layer and the light guide layer and having a refractive index which is lower than a refractive index of the first conductivity type cladding layer,
  wherein λ is an oscillating wavelength of the semiconductor laser device, nc is refractive indexes of the first conductivity type cladding layer and the second conductivity type cladding layer, ng is a refractive index of the light guide layer, a layer thickness d of the light guide layer is a value at which a high-order mode equal to or higher than a first-order mode is permissible in a crystal growing direction by satisfying $$\frac{2\pi}{\lambda}\sqrt{n_g^2 - n_c^2}\frac{d}{2} \geq \frac{\pi}{2},$$

and
  the active layer is disposed at a position where a light confinement of the active layer becomes smaller compared to a device in which the active layer is disposed at a center of the light guide layer while there is not the first conductivity type low-refractive-index layer, but which is otherwise the same as the semiconductor laser device.

2. The semiconductor laser device of claim 1, further comprising a second conductivity type low-refractive-index layer formed between the light guide layer and the second conductivity type cladding layer and having a refractive index which is lower than a refractive index of the second conductivity type cladding layer,
  wherein n11 is a refractive index of the first conductivity type low-refractive-index layer, d11 is a layer thickness of the first conductivity type low-refractive-index layer, n12 is a refractive index of the second conductivity type low-refractive-index layer, d12 is a layer thickness of the second conductivity type low-refractive-index layer, and $\sqrt{n_c^2 - n_{11}^2}d_{f1} > \sqrt{n_c^2 - n_{12}^2}d_{f2}$
is satisfied.

3. The semiconductor laser device of claim 2, wherein the semiconductor laser device is a ridge type laser having a ridge structure formed by removing the second conductivity type cladding layer up to the second conductivity type low-refractive-index layer.

4. The semiconductor laser device of claim 1, wherein the semiconductor laser device is a ridge type laser having a ridge structure formed by removing the second conductivity type cladding layer up to a midpoint.

5. A semiconductor laser device comprising:
  a semiconductor substrate of a first conductivity type;
  a first conductivity type cladding layer on the semiconductor substrate;
  a light guide layer including a first light guide layer of the first conductivity type on the first conductivity type cladding layer and a second light guide layer of a second conductivity type on the first light guide layer, the second light guide layer comprising a first portion and a second portion;
  an active layer in the second light guide layer, so that the first portion of the second light guide layer is below the active layer, and the second portion of the second light guide layer is above the active layer; and
  a second conductivity type cladding layer on the second light guide layer,
  wherein a refractive index of the second light guide layer is higher than a refractive index of the first light guide layer,
  a layer thickness of the second light guide layer is smaller than a layer thickness of the first light guide layer,
  λ is an oscillating wavelength of the semiconductor laser device, nc is refractive indexes of the first conductivity type cladding layer and the second conductivity type cladding layer, ng is a refractive index of the first light guide layer, a sum d of a layer thickness of the first light guide layer and a layer thickness of the second light guide layer is a value at which a high-order mode equal to or higher than a first-order mode is permissible in a crystal growing direction by satisfying $$\frac{2\pi}{\lambda}\sqrt{n_g^2 - n_c^2}\frac{d}{2} \geq \frac{\pi}{2},$$

and
  the active layer is disposed at a position where a light confinement of the active layer becomes smaller compared to a case in which the refractive indexes of the first light guide layer and the second light guide layer are the same and the active layer is disposed at a center of the light guide layer.

6. The semiconductor laser device of claim 5, further comprising a first conductivity type low-refractive-index layer formed between the first conductivity type cladding layer and the light guide layer and having a refractive index which is lower than a refractive index of the first conductivity type cladding layer.

7. The semiconductor laser device of claim 6, further comprising a second conductivity type low-refractive-index layer formed between the second conductivity type cladding layer and the light guide layer and having a refractive index which is lower than a refractive index of the second conductivity type cladding layer,
  wherein n11 is a refractive index of the first conductivity type low-refractive-index layer, d11 is a layer thickness of the first conductivity type low-refractive-index layer, n12 is a refractive index of the second conductivity type low-refractive-index layer, d12 is a layer thickness of the second conductivity type low-refractive-index layer, and $\sqrt{n_c^2 - n_{11}^2}d_{f1} > \sqrt{n_c^2 - n_{12}^2}d_{f2}$
is satisfied.

8. The semiconductor laser device of claim 7, wherein the semiconductor laser device is a ridge type laser having a ridge structure formed by removing the second conductivity type cladding layer up to the second conductivity type low-refractive-index layer.

9. The semiconductor laser device of claim 5, wherein the semiconductor laser device is a ridge type laser having a ridge structure formed by removing the second conductivity type cladding layer up to a midpoint.

10. A semiconductor laser device comprising:
a semiconductor substrate of a first conductivity type;
a first conductivity type cladding layer on the semiconductor substrate;
a light guide layer including a first light guide layer of the first conductivity type on the first conductivity type cladding layer and a second light guide layer of a second conductivity type on the first light guide layer, the second light guide layer comprising a first portion and a second portion;
an active layer in the second light guide layer, so that the first portion of the second light guide layer is below the active layer, and the second portion of the second light guide layer is above the active layer;
a second conductivity type cladding layer on the second light guide layer; and
a first conductivity type low-refractive-index layer formed between the first conductivity type cladding layer and the light guide layer and having a refractive index which is lower than a refractive index of the first conductivity type cladding layer,
wherein a refractive index of the second light guide layer is higher than a refractive index of the first light guide layer,
a layer thickness of the second light guide layer is smaller than a layer thickness of the first light guide layer,
$\lambda$ is an oscillating wavelength of the semiconductor laser device, nc is refractive indexes of the first conductivity type cladding layer and the second conductivity type cladding layer, ng is a refractive index of the first light guide layer, a sum d of a layer thickness of the first light guide layer and a layer thickness of the second light guide layer is a value at which a high-order mode equal to or higher than a first-order mode is permissible in a crystal growing direction by satisfying $$\frac{2\pi}{\lambda}\sqrt{n_g^2-n_c^2}\frac{d}{2} \geq \frac{\pi}{2},$$

and
the active layer is disposed at a position where a light confinement of the active layer becomes smaller compared to a case in which the refractive indexes of the first light guide layer and the second light guide layer are the same, refractive indexes of the first conductivity type cladding layer and the second conductivity type cladding layer are the same, the active layer is disposed at a center of the light guide layer while there is not the first conductivity type low-refractive-index layer.

11. The semiconductor laser device of claim 10, further comprising a second conductivity type low-refractive-index layer formed between the light guide layer and the second conductivity type cladding layer and having a refractive index which is lower than a refractive index of the second conductivity type cladding layer,
wherein n11 is a refractive index of the first conductivity type low-refractive-index layer, d11 is a layer thickness of the first conductivity type low-refractive-index layer, n12 is a refractive index of the second conductivity type low-refractive-index layer, d12 is a layer thickness of the second conductivity type low-refractive-index layer, and $\sqrt{n_c^2-n_{11}^2}d_{l1} > \sqrt{n_c^2-n_{12}^2}d_{l2}$ is satisfied.

12. The semiconductor laser device of claim 11, wherein the semiconductor laser device is a ridge type laser having a ridge structure formed by removing the second conductivity type cladding layer up to the second conductivity type low-refractive-index layer.

13. The semiconductor laser device of claim 10, wherein the semiconductor laser device is a ridge type laser having a ridge structure formed by removing the second conductivity type cladding layer up to a midpoint.

* * * * *